United States Patent
Perrott et al.

(10) Patent No.: US 9,444,406 B1
(45) Date of Patent: Sep. 13, 2016

(54) AMPLIFIER TOPOLOGY ACHIEVING HIGH DC GAIN AND WIDE OUTPUT VOLTAGE RANGE

(71) Applicant: Silicon Laboratories Inc., Austin, TX (US)

(72) Inventors: Michael H. Perrott, Nashua, NH (US); Srisai R. Seethamraju, Nashua, NH (US); Timothy A. Monk, Hudson, NH (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/985,677

(22) Filed: Dec. 31, 2015

Related U.S. Application Data

(60) Provisional application No. 62/186,007, filed on Jun. 29, 2015.

(51) Int. Cl.
| | |
|---|---|
| *H03M 1/34* | (2006.01) |
| *H03F 1/02* | (2006.01) |
| *H03F 3/45* | (2006.01) |
| *H03M 1/12* | (2006.01) |

(52) U.S. Cl.
CPC ........ *H03F 1/0205* (2013.01); *H03F 3/45179* (2013.01); *H03M 1/12* (2013.01); *H03F 2203/45112* (2013.01)

(58) Field of Classification Search
CPC .................. H03F 2203/45112; H03M 1/145; H03M 1/164
USPC ............. 341/155, 172, 163, 161; 330/85, 88
See application file for complete search history.

(56) References Cited

U.S. PATENT DOCUMENTS

| | | | |
|---|---|---|---|
| 6,380,787 B1* | 4/2002 | Forbes | H03K 3/356113 326/30 |
| 7,012,450 B1* | 3/2006 | Oner | H04L 25/0276 326/86 |
| 8,299,952 B1 | 10/2012 | Lin et al. | |
| 8,362,939 B2 | 1/2013 | Buter et al. | |
| 2007/0171748 A1* | 7/2007 | Mukhopadhyay | G11C 11/413 365/208 |
| 2008/0084245 A1* | 4/2008 | Dequiedt | H03F 3/45076 330/253 |
| 2014/0176221 A1* | 6/2014 | Lin | H03L 5/00 327/333 |

OTHER PUBLICATIONS

Data Converters, "EE247 Lecture 18," 2004 H.K., pp. 1-49, http://www-inst.eecs.berkeley.edu/~ee247/fa04/fa04/lectures/L18_f04.pdf.

* cited by examiner

*Primary Examiner* — Peguy Jean Pierre
(74) *Attorney, Agent, or Firm* — Abel Law Group, LLP

(57) ABSTRACT

An amplifier topology achieves enhances DC gain to improve linearity while maintaining a good signal to noise ratio. The amplifier includes an amplifier output stage that supplies an amplifier output signal. The amplifier also includes a sense amplifier that augments the output stage. The sense amplifier is coupled to the amplifier input to control current through the output stage in order to achieve reduced voltage variation at the amplifier input as a function of the amplifier output signal voltage as compared to a basic common source amplifier and thereby enhances DC gain of the amplifier.

20 Claims, 22 Drawing Sheets

AMPLIFIER TOPOLOGY ACHIEVING HIGH DC GAIN AND WIDE OUTPUT VOLTAGE RANGE

CROSS-REFERENCE TO RELATED APPLICATION(S)

This application claims benefit of U.S. Provisional Application No. 62/186,007, filed Jun. 29, 2015, entitled "Amplifier Topology Achieving High DC Gain And Wide Output Voltage Range", naming Michael H. Perrott, et al., as inventors, which application is incorporated herein by reference.

BACKGROUND

1. Field of the Invention

This application relates to amplifiers and more particularly to amplifier topologies providing high DC gain.

2. Description of the Related Art

Amplifiers are an essential component in many analog circuits, and often set the bottleneck for the dynamic and noise performance of such systems. An example system for which an amplifier plays a key role is a switched capacitor network used within a pipelined analog-to-digital converter (ADC). FIG. 1A illustrates a high level block diagram of one stage of a pipelined ADC. The input voltage Vin is sampled in sample and hold circuit 101. The input voltage is also supplied to analog-to-digital converter (ADC) 103, which converts the voltage to an "M" bit digital representation. M may be e.g., one bit or several bits. The M bit(s) are supplied to a combiner block (not shown) and also to a digital-to-analog converter (DAC) 105, which converts the M bit representation to an analog value. That analog voltage is then subtracted from the input voltage in the summing circuit 107 and the residue after the subtraction is amplified in amplifier 109 and supplied to the next stage in the pipelined ADC.

FIG. 1B illustrates a high level diagram of a pipelined ADC showing various stages of the pipelined ADC and the digital combiner block 121 that combines the digital outputs of the various stages. FIG. 1C shows an embodiment of a switched capacitor network that may be used in each stage 100 to sample the voltage input to the stage (Vin), subtract a quantized representation of that sampled value ($\alpha$Vref) and then amplify the residue. In the example shown in FIG. 1C, M=1 and a is +1 or −1 for M=1 and $\alpha$ is set according to a separate ADC that feeds the DAC as shown in FIG. 1A. If M>1, then the ADC may be modeled as one capacitor (as in FIG. 1C) with $\alpha$ having values between −1 and 1. In FIG. 1C, $C_f$ is the feedback capacitor, $C_s$ is the sample capacitor, $C_{par}$ is parasitic capacitance, $C_L$ is load capacitance. Amplifier 109 receives the residue input $V_m$ (where "m" is minus to reflect the inverting nature of the amplifier) and $V_{cm}$ is the common mode input (assumes a single-ended system, as is shown). The clock signals $\Phi_1$, $\Phi_{1p}$, and $\Phi_2$ control the switches of the switched capacitor network in non-overlapping manner to configure the network for sampling as shown at 131 or to configure the network to amplify the residue as shown at 133. Clock signal $\Phi_{1p}$ drives the auto-zero switches. Key performance issues of such an amplifier are the signal-to-noise ratio (SNR) and linearity that it achieves in amplifying the residue. To achieve high SNR, it is beneficial to achieve a wide output swing of the amplifier. However, it is challenging to maintain high linearity with a wide output swing, so that a trade-off often exists in achieving excellent SNR versus linearity performance.

To improve linearity while maintaining good SNR, it is highly desirable to achieve a large DC gain for the amplifier. FIG. 2 shows a basic common source amplifier along with a calculation of its DC gain. A key metric for determining such DC gain is the product of the transistor transconductance, $g_m$, and its output resistance, $r_o$. This $g_m r_o$ product is referred to as the intrinsic gain of the transistor device, and it is desirable that $g_m r_o$ have a large value in order to achieve large DC gain for the amplifier. Assuming that the amplifier is implemented with CMOS transistors, an important trend to consider is that advanced CMOS fabrication technologies often offer low values of $g_m r_o$, which creates challenges in achieving high DC gain of amplifiers in such processes. The term $r_{op}$ in FIG. 2 refers to output resistance associated with the PMOS device 201 and $r_{on}$ to output resistance associated the NMOS device 203.

To further improve DC gain of an amplifier beyond what is offered by the basic common source structure, topological changes can be made to the amplifier. As indicated in FIG. 2, the most common approaches for such DC gain boosting are to utilize multiple amplifier stages, cascoding of transistors, and cascode-based gain enhancement. Most modern amplifiers used within pipeline ADCs leverage a combination of these techniques to achieve high DC gain. Note that compensation to achieve stability of multiple gain stages in feedback gets complicated with more than two stages.

FIG. 3 shows a folded cascode amplifier which is commonly used within pipeline ADCs. The technique of cascode-based gain enhancement in FIG. 3 is leveraged to achieve high DC gain and acceptable output swing. Unfortunately, while this topology has been very effectively used in older CMOS fabrication processes such as 180 nm CMOS, it suffers from insufficient DC gain and output swing in more modern processes such as 55 nm CMOS due to the relatively low $g_m r_o$ and low voltage supply encountered with such processes. In general, cascode-based gain enhancement suffers under low supply voltage constraints as encountered with modern CMOS processes.

Accordingly, improvements in amplifier topologies to provide DC gain enhancement with wide output swing is desirable.

SUMMARY OF EMBODIMENTS OF THE INVENTION

In contrast to the traditional gain boosting approaches discussed above, an alternative amplifier topology achieves gain enhancement without requiring the use of cascode transistors. While this approach allows complete removal of cascode transistors, selective use of cascode transistors can be incorporated with negligible impact on the output swing of the amplifier. Overall, excellent voltage swing resulting in high SNR and high DC gain providing high linearity can be simultaneously achieved. The amplifier may be particularly useful as a residue amplifier in a switched capacitor pipelined ADC.

In an embodiment, an apparatus has an amplifier that includes an amplifier output stage with a first and a second transistor. The output stage supplies an amplifier output signal at an amplifier output node. A sense amplifier, augmenting the output stage, has an input coupled to a gate of the first transistor and has an output coupled to a gate of the second transistor to thereby control current in the output stage supplied from the second transistor. An impedance is coupled between the amplifier output node and the gate of the first transistor. Controlling the current in the output stage using the sense amplifier provides a way to reduce voltage variation at the gate of the first transistor as a function of voltage of the amplifier output signal.

In another embodiment a method includes receiving an input signal at an amplifier input node, amplifying the input signal using an amplifier, and supplying an amplifier output signal. The method further includes sensing input voltage at the amplifier input node using a sense amplifier and adjusting current in an output stage of the amplifier based on an output of the sense amplifier and feeding back the output signal. The method provides a way to reduce voltage variation at the amplifier input node as a function of voltage of the amplifier output signal.

In another embodiment, a switched capacitor analog-to-digital converter is provided having a plurality of stages. At least one of the stages includes a switched capacitor network including at least a first capacitor and a second capacitor. An amplifier is coupled to the first and second capacitors. The amplifier includes an amplifier output stage supplying an amplifier output signal at an amplifier output node. A sense amplifier is coupled to sense voltage at an input node of the amplifier and provides a way to reduce voltage variation at the input node as a function of voltage of the amplifier output signal by controlling current through the amplifier output stage based on the sensed voltage. The first capacitor is coupled between the amplifier output node and the input node of the amplifier

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1A:
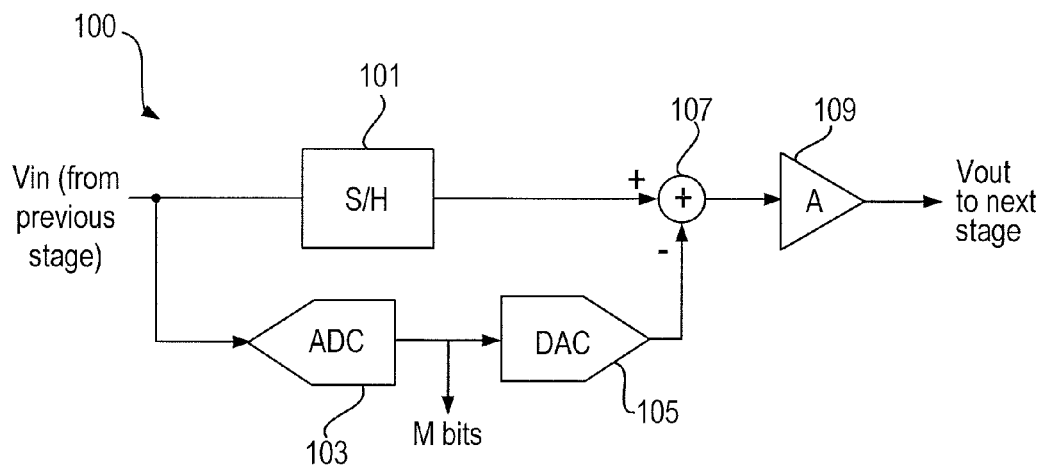
FIG. 1A illustrates a high level diagram of one stage of a pipelined analog-to-digital converter (ADC).
Figure 1B:
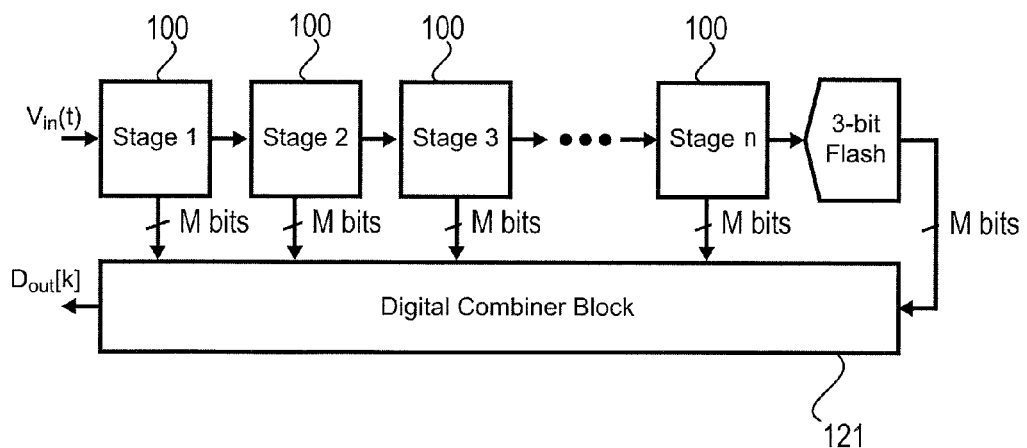
FIG. 1B illustrates a high level diagram of a pipelined analog-to-digital converter (ADC).
Figure 1C:
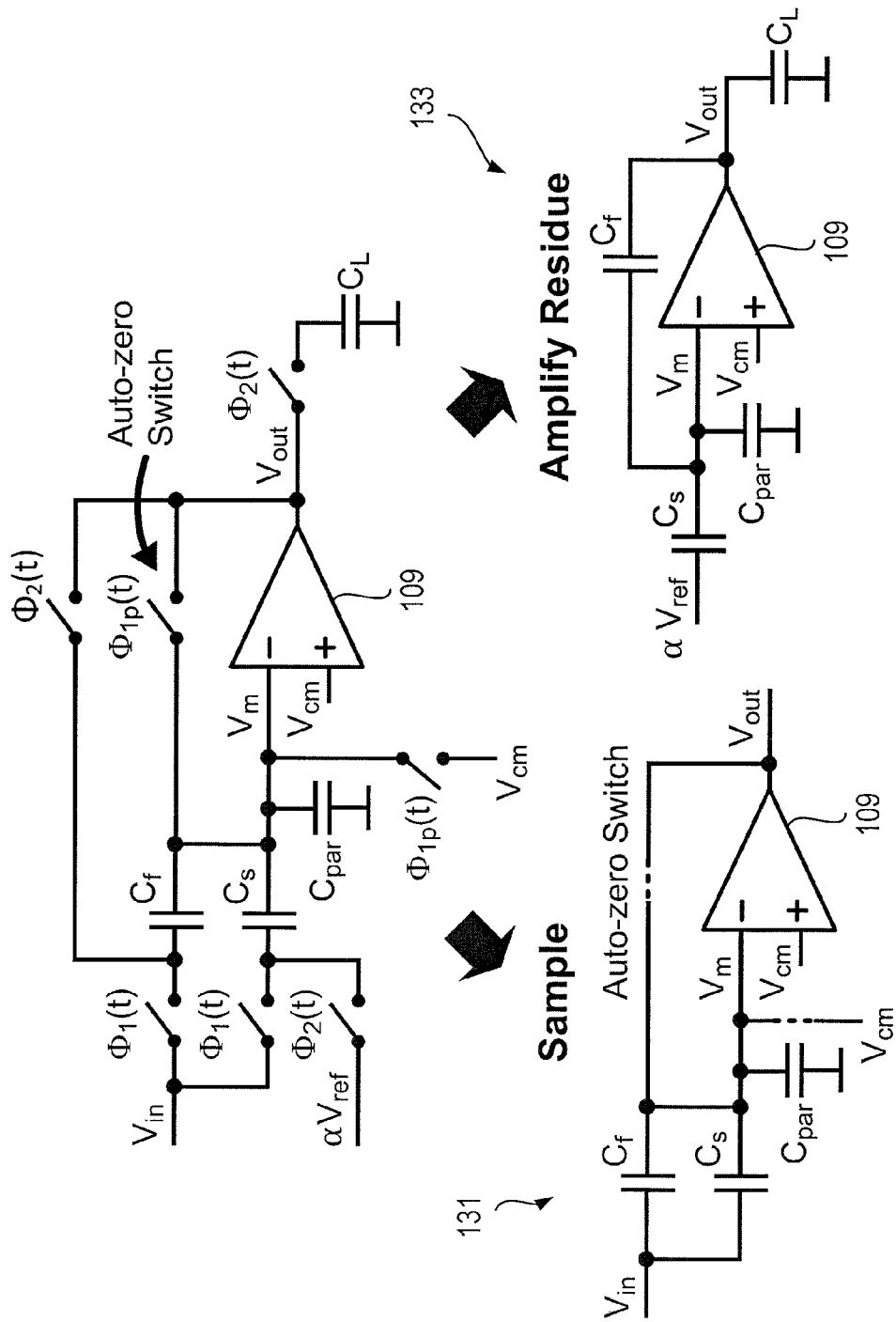
FIG. 1C illustrates a high level diagram of a switched capacitor circuit used in a pipelined analog-to-digital converter (ADC) stage.
Figure 2:
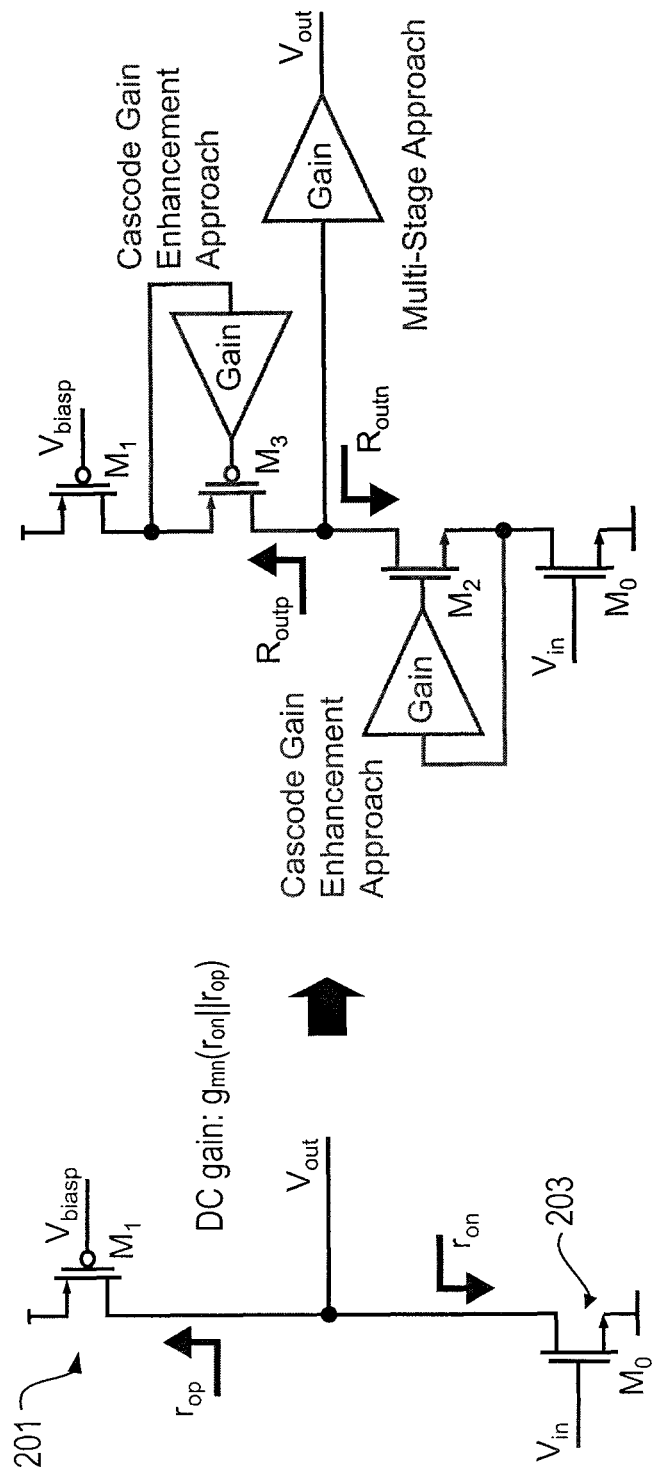
FIG. 2 illustrates DC gain calculation for a basic common source amplifier and common approaches for increasing the DC gain through changes in the amplifier topology.
Figure 3:
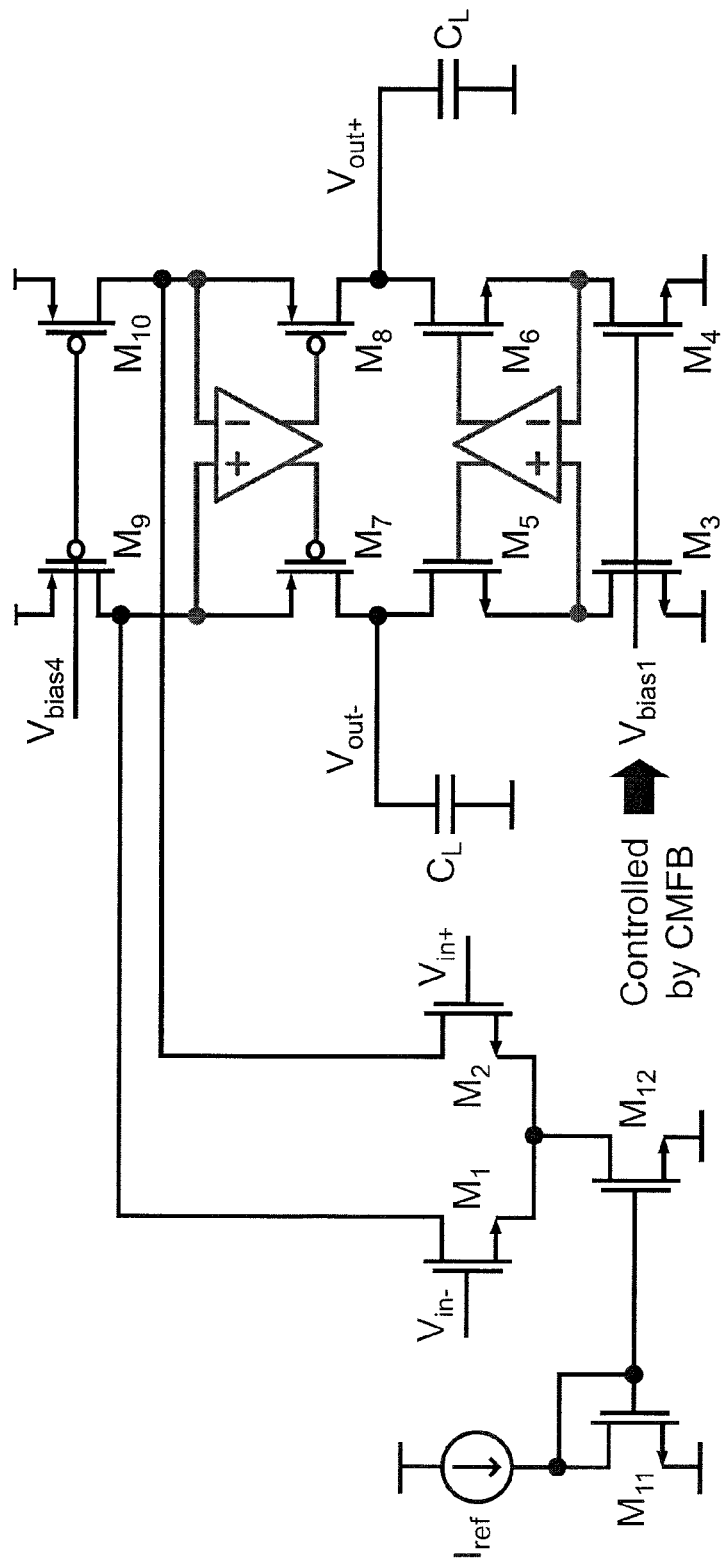
FIG. 3 illustrates a folded cascode amplifier topology.
Figure 4A:
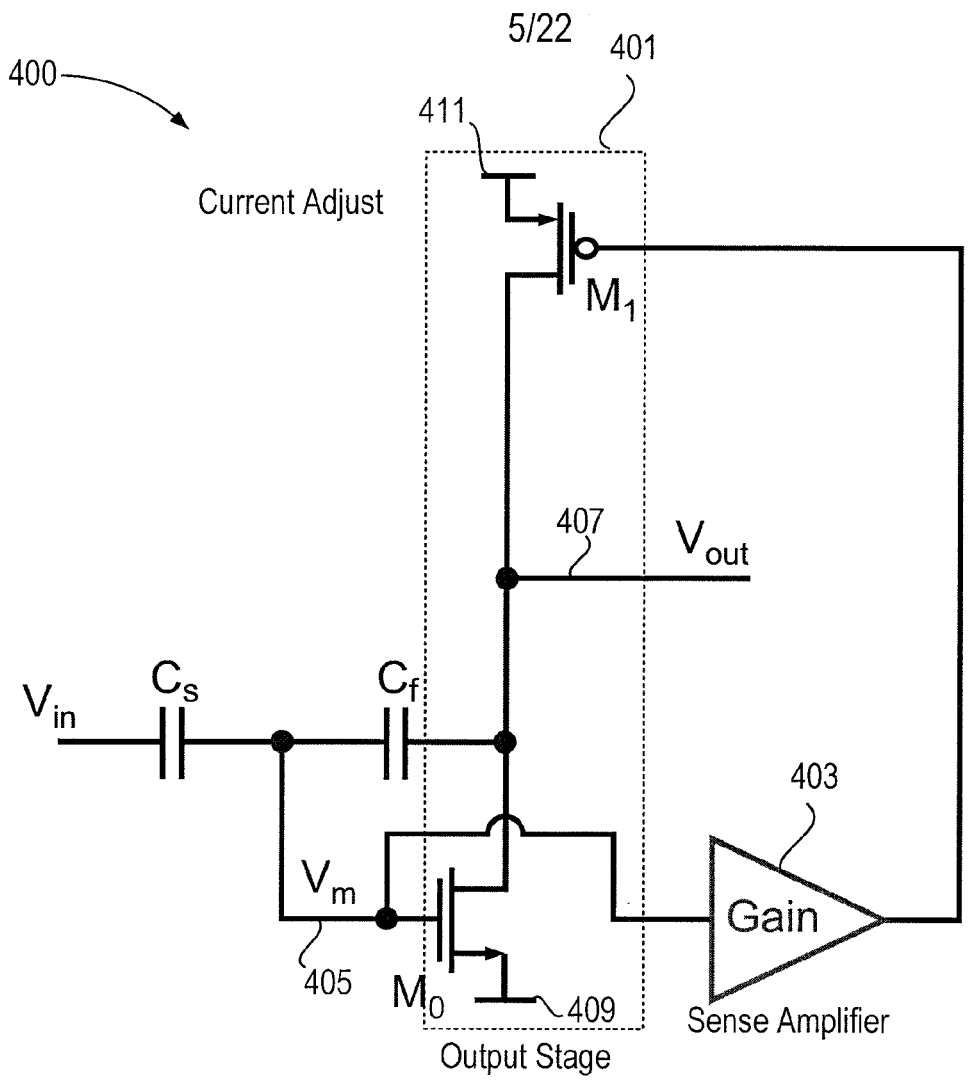
FIG. 4A illustrates a DC gain boosting approach for an amplifier according to an embodiment of the invention.

FIG. 4A shows a simplified view of amplifier topology 400 according to an embodiment assuming the amplifier is placed within a feedback loop including capacitors $C_s$ and $C_f$. The topology includes a sense amplifier 403 and an output stage 401 that includes transistors $M_0$ and $M_1$. The amplifier input is received at node 405 ($V_m$) and the amplifier output ($V_{out}$) is supplied on node 407. As shown in FIG. 4A, DC gain is boosted by sensing the voltage $V_m$ at the gate node using sense amplifier 403 and correspondingly adjusting the current coming from device $M_1$ based on the input voltage sensed by sense amplifier 403 in order to reduce the variation of $V_m$ that occurs for realizing different values of $V_{out}$. Note that this technique can also be applied with the role of NMOS and PMOS devices being exchanged such that an NMOS device, rather than a PMOS device, is used to adjust current and a PMOS, rather than NMOS device, is used for connection of the capacitive feedback network. However, an advantage of the topology shown in FIG. 4A is that the ground node 409 rather than supply node 411 serves as the voltage reference of the amplifier, which is convenient in many applications which seek excellent noise performance. Note that the ground node and supply nodes are similarly coupled in other embodiments illustrated herein but are not specifically labeled in the other illustrated embodiments to simplify the figures.

Figure 4B:
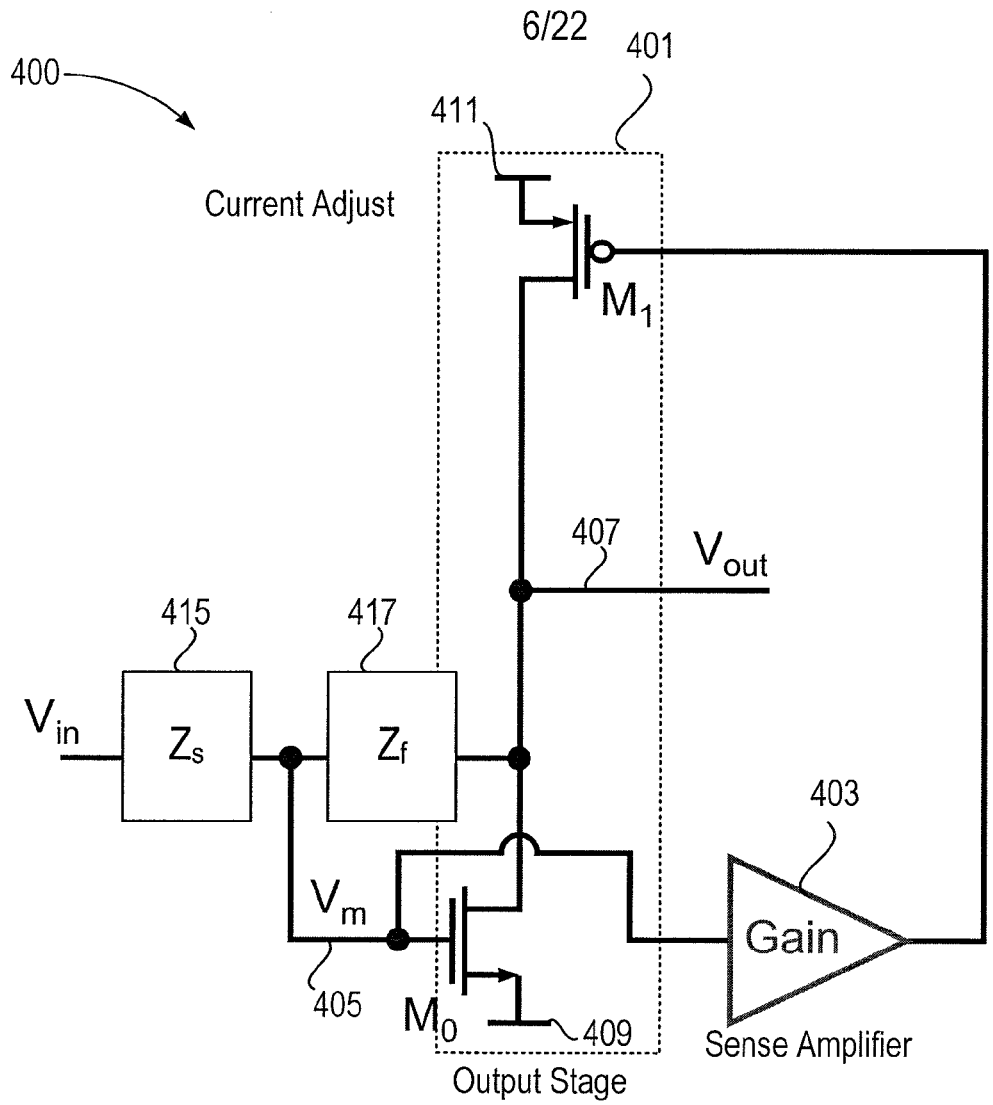
FIG. 4B illustrates a more general DC gain boosting approach for an amplifier according to an embodiment of the invention.

FIG. 4B shows a more general topology showing the use of impedances $Z_s$ 415 and $Z_f$ 417 rather than the capacitances $C_s$ and $C_f$. While capacitance may be preferred in some embodiments, other impedance such as a resistive network or some other impedance combination, e.g., resistive and capacitive, may also be used. In general, the topology can use arbitrary impedance in the feedback.

Figure 5:
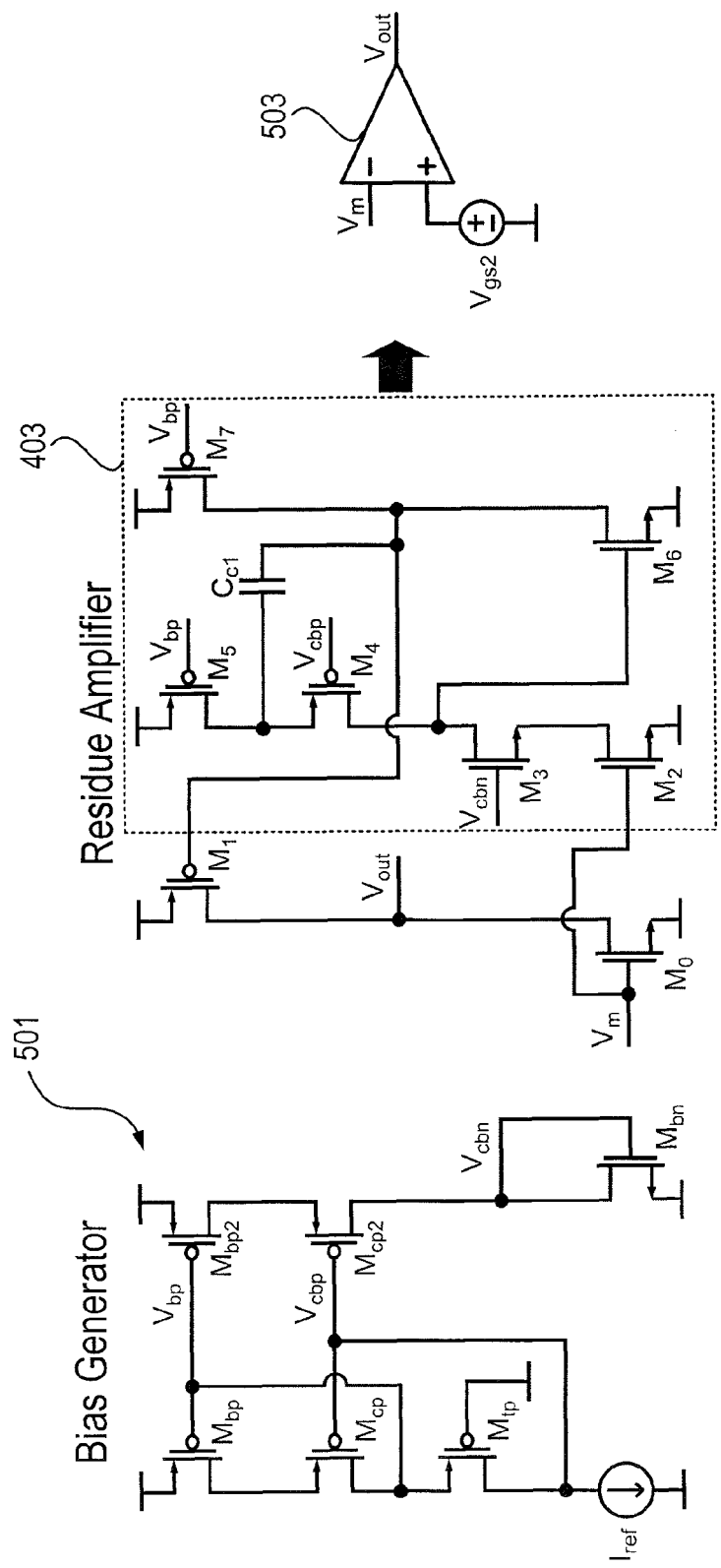
FIG. 5 illustrates an example amplifier topology with a bias network that utilizes a DC gain boosting approach according to an embodiment of the invention.

FIG. 5 shows additional details of an embodiment of the amplifier topology that enhances DC gain, along with a corresponding example bias network 501. In FIG. 5 the common source amplifier with current bias formed by devices $M_0$ and $M_1$, which is referred to as the output stage of the amplifier, is augmented with a two-stage sense amplifier embodiment composed of devices $M_2$-$M_7$. The output of the two-stage sense amplifier 403 controls the current from device $M_1$ such that voltage variation at node $V_m$ as a function of $V_{out}$ is reduced compared to what would be encountered with a basic common source amplifier. Cascode devices $M_3$ and $M_4$ are utilized in the first stage of the sense amplifier in order to boost its DC gain, though they could be removed if reduced circuit complexity were desired and the additional DC gain boost they provide is not needed. This particular application of cascoding is not an issue for signal swing since the first stage of the sense amplifier need only support very small signal swing levels. Also, Miller compensation is utilized in the sense amplifier using capacitor $C_{c1}$, as will be discussed later. The bias network 501 supplies bias voltages $V_{cbp}$ and $V_{cbn}$ for the cascode devices where the subscript "c" refers to cacscode, "b" refers to bias, "p" is PMOS, and "n" is NMOS. The bias network 501 also supplies the bias voltage $V_{bp}$ for the current source devices $M_5$ and $M_7$. The transistor $M_{1p}$ operates in the triode region. Finally, FIG. 5 shows a high level representation 503 of the amplifier, which is similar to a classical operational amplifier except that the positive terminal voltage is set to the gate-to-source bias voltage of device $M_2$, which is labeled as $V_{gs2}$. As such, the proposed amplifier structure is single-ended in nature with a set input common-mode voltage value. In general, the fixed common-mode voltage is acceptable for AC-coupled amplifier configurations, including switched capacitor circuits as utilized within pipeline ADC applications. Note that the input common-mode voltage is compatible with the output range of the amplifier such that auto-zero techniques can be easily employed when using the amplifier within switched capacitor circuits.

Figure 6:
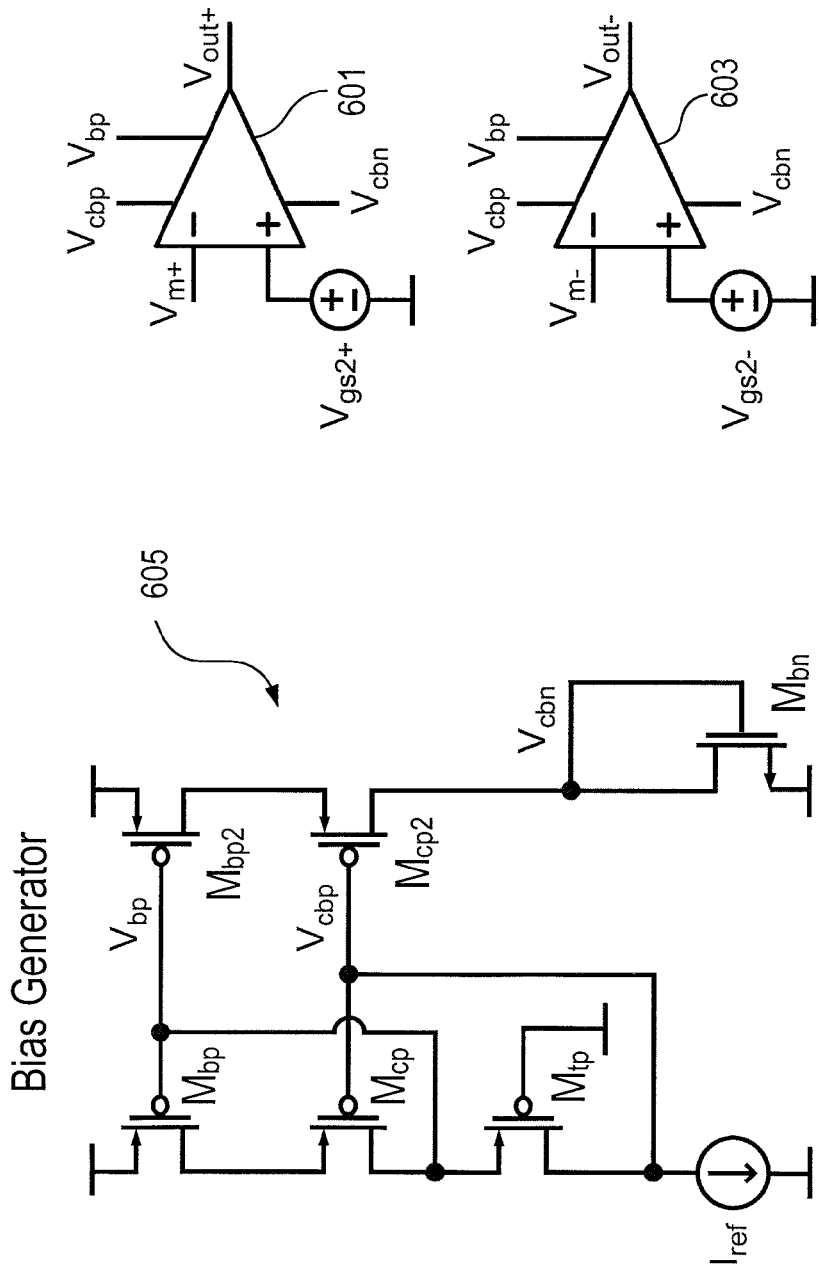
FIG. 6 illustrates a pseudo-differential version of an amplifier structure according to an embodiment of the invention.

FIG. 6 shows a pseudo-differential embodiment of the amplifier structure which includes two single-ended structures 601 and 603 that have a common bias circuit 605. In the pseudo differential embodiment, differential input signals ($V_{m+}$ and $V_{m-}$) and output signals ($V_{out+}$ and $V_{out-}$) can be utilized, but the input common-mode voltage of the amplifier is still fixed. The value of sharing the same bias for both single-ended structures is that, under the assumption of good matching, noise generated by the bias will be common to both structures and therefore be cancelled when utilizing the differential component of the output signals. Other embodiments may utilize separate bias circuits.

Figure 7:
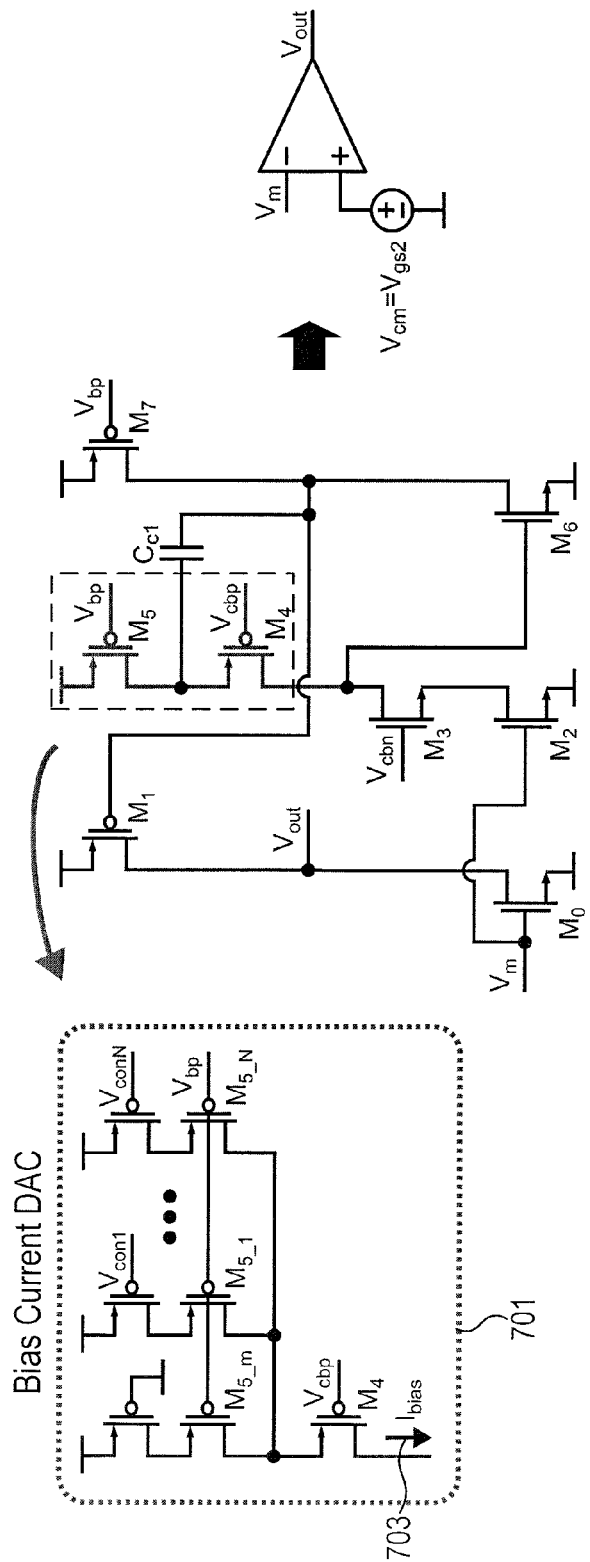
FIG. 7 illustrates adjustment of the input bias voltage of a single-ended amplifier structure embodiment.

In some applications, it is desirable to achieve a low offset voltage between the amplifiers for the pseudo-differential amplifier structure shown in FIG. 6. In that case, it is useful to be able to trim the input bias voltage of each single-ended amplifier within the pseudo-differential structure. To achieve such trimming, the voltage $V_{gs2}$ can be adjusted by using a current-based digital-to-analog structure within the current bias of the first stage of the sense amplifier as shown in FIG. 7. The trimming approach utilizes a bias current DAC 701, which alters the bias current 703 supplied through cascode transistor $M_3$ to transistor $M_2$ to trim the voltage $V_{gs2}$. Note that this method of trimming can also be utilized even in the absence of cascade devices M3 and M4. The advantage of this trimming approach is that the offset adjustment is performed on devices that are outside of the key signal path of the amplifier, which aids in achieving a high bandwidth design. One should note that such current trimming can also be applied to the $M_7$ device shown in FIG. 7 in order to control the nominal gate-to-source voltage of device $M_6$, referred to as $V_{gs6}$, so as to ensure that cascade devices $M_3$ and $M_4$ operate within their saturation region.

Figure 8:
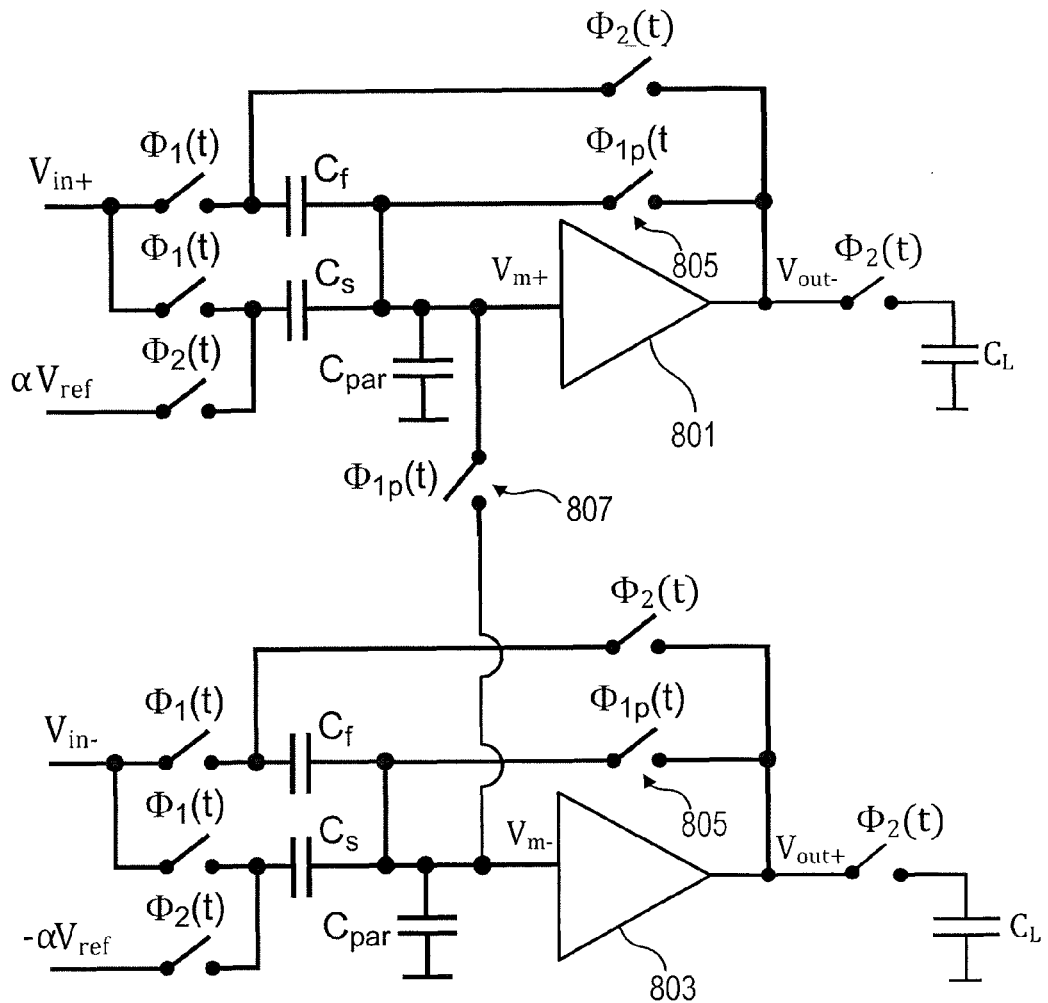
FIG. 8 illustrates an exemplary 1-bit pipeline ADC stage using a pseudo-differential embodiment of the amplifier structure along with an auto-zero technique that is augmented with a differential shorting switch to improve differential settling time in sampling mode.

FIG. 8 shows a high level diagram of an example pipeline ADC stage that is implemented using the pseudo-differential version of an embodiment of the amplifier. In the example of FIG. 8, α is +1 or −1 and is set according to a separate ADC that feeds the DAC. Note that multiple switches coupled to distinct voltages may be used instead of the single switch shown to achieve ±αVref. The offset between the pseudo-differential amplifiers 801 and 803 can be reduced by trimming the bias current as shown in FIG. 7. Auto-zeroing, which may be applied during the sampling operation of the ADC stage, may be aided by including a switch 805 between the input and output of the individual amplifiers as shown in the figure. An extra switch 807 may be used to help speed up the differential settling characteristic of the sampling operation. As with any switched capacitor based pipeline stage, the residue amplification operation is performed through proper change of the switch settings. Note that standard non-overlapping clock techniques should be used as is common in pipelined ADCs.

A closer inspection of the proposed amplifier topology shown in FIG. 5 reveals that it has three gain stages. Typically, one or two stage amplifier topologies are preferred for applications where the amplifier is placed within feedback in order to achieve one dominant pole and ensure that non-dominant poles are placed much higher in frequency. A common approach for achieving such conditions in two stage amplifier topologies is to apply Miller compensation. However, classical Miller compensation is not typically applied when greater than two gain stages are present. Instead, more complicated approaches such as nested Miller compensation are often considered in such cases.

Figure 9:
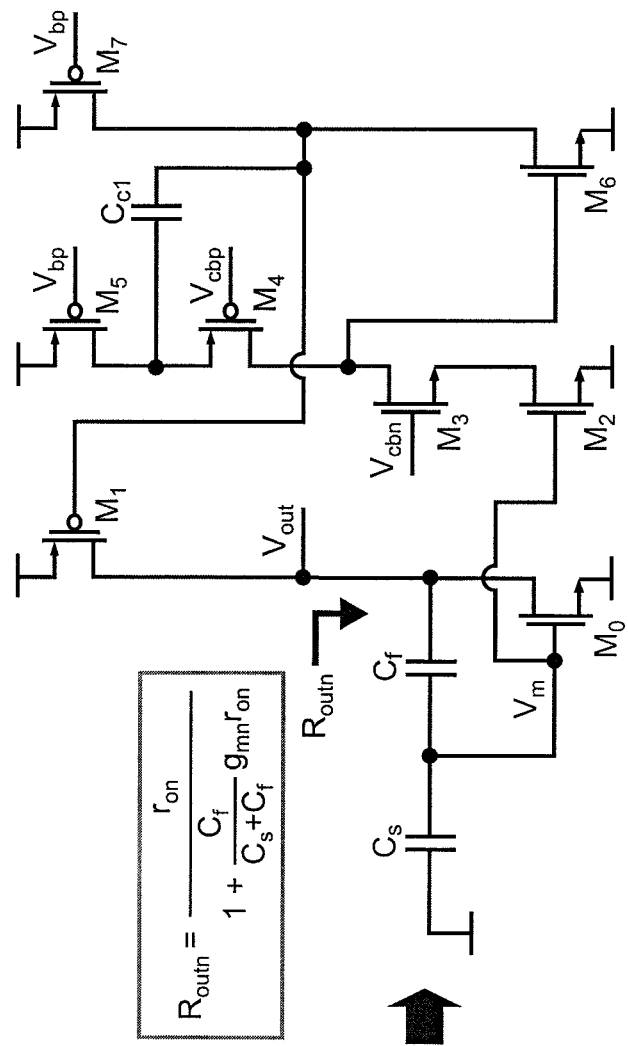
FIG. 9 illustrates reduction of output impedance in the output stage of the amplifier due to capacitive feedback.
Figure 9:
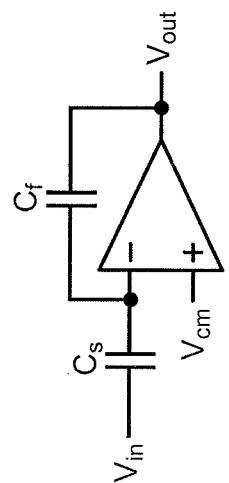

When considering the capacitor feedback network shown in FIG. 9, we find that classical Miller compensation can be used for the amplifier topology shown in FIG. 5, which provides enhanced DC gain, despite the fact that it contains more than two gain stages. To explain, consider the impact of the capacitor feedback on the output stage of the amplifier as shown in FIG. 9. As indicated by the expression shown in the figure, the presence of the capacitor feedback formed by $C_s$ and $C_f$ causes a reduction in the impedance at the output stage of the amplifier formed by devices $M_0$ and $M_1$. This reduction in output impedance, in turn, increases the frequency of the non-dominant pole formed by the output stage of the amplifier. In advanced CMOS processes, the reduction in output impedance is also aided by the fact that the reduced $g_m r_o$ product is primarily due to reduced $r_o$. As indicated by the expression shown in FIG. 9, the combination of reduced $r_o$ and presence of capacitive feedback allows achievement of a relatively low output impedance and therefore high frequency non-dominant pole for the output stage of the amplifier.

Figures 10A, 10B, 10C:
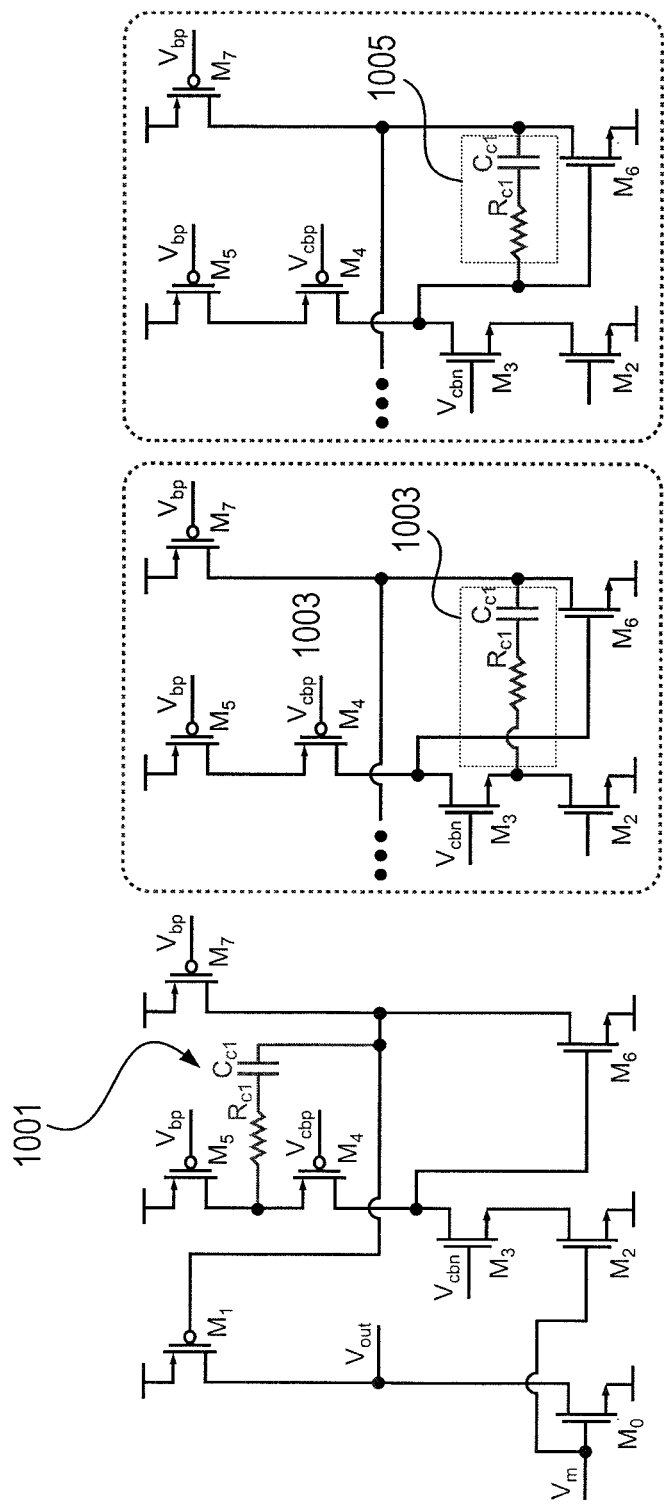
FIG. 10A illustrates utilization of classical two-stage Miller compensation for a three stage amplifier embodiment.
FIG. 10B illustrates another embodiment utilizing classical two-stage Miller compensation for a three stage amplifier embodiment.
FIG. 10C illustrates another embodiment utilizing classical two-stage Miller compensation for a three stage amplifier embodiment.

Given a relatively high frequency non-dominant pole for the output stage of the amplifier, frequency compensation of the overall amplifier can be achieved with classical two stage Miller compensation as shown in FIGS. 10A, 10B, and 10C. In such case, the dominant pole is set by the first stage of the sense amplifier (devices $M_2$-$M_5$), and the non-dominant pole of the second stage of the sense amplifier (devices $M_6$-$M_7$) is pushed to higher frequencies by the presence of the capacitive feedback provided by capacitor $C_{c1}$. As indicated in FIGS. 10A, 10B, and 10C, there are several options for achieving Miller compensation, with the preferred approach being shown at 1001 in FIG. 10A. Note that the presence of the resistor $R_{c1}$ creates a left half S-plane zero, which is useful in achieving improved phase margin for the amplifier. However, for the preferred approach 1001, the value of $R_{c1}$ will typically be set to zero. Other embodiments may use the compensation configuration shown in FIG. 10B at 1003 for capacitor $C_{c1}$ and resistor $R_{c1}$ or the compensation configuration shown in FIG. 10C for capacitor $C_{c1}$ and resistor $R_{c1}$ at 1005.

Figure 11:
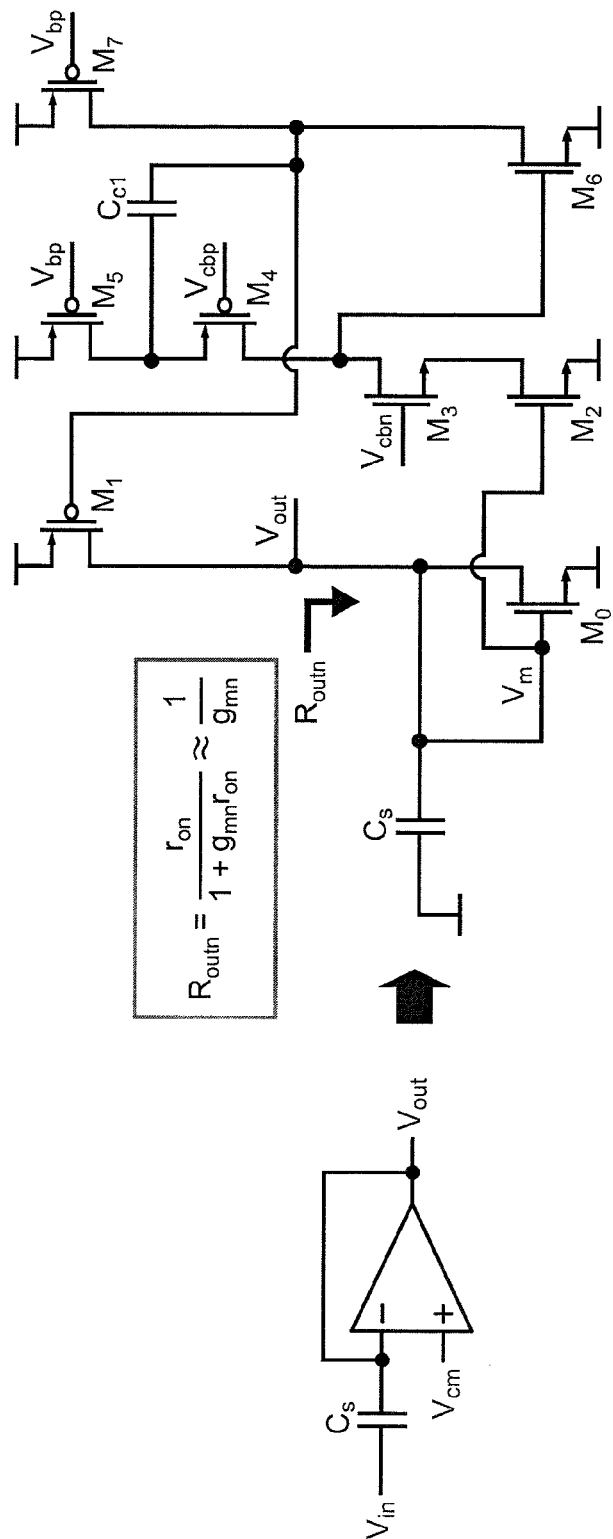
FIG. 11 illustrates impact of auto-zero configuration of the amplifier on the impedance of the amplifier output stage.

When considering an auto-zero configuration for the proposed amplifier, as shown in FIG. 11 where a feedback switch is assumed to be turned on and, for simplicity, have zero resistance, one should note the resulting drop in output impedance of the output stage of the amplifier as indicated by the expression in the figure. This drop in output impedance leads to a reduction in the DC gain of the amplifier, which tends to lower the unity gain frequency of the amplifier. As such, when using the proposed amplifier within a pipeline ADC, the sampling operation (which may employ an auto-zero configuration) may not necessarily have faster settling than what occurs for the residue amplification operation.

While using three stages instead of two is helpful in achieving higher DC gain for the amplifier, the achievable DC gain will still be inadequate for many high performance applications such as high resolution pipeline ADCs. Embodiments may utilize a technique that is referred to herein as "lateral gain enhancement" to further improve DC gain while still maintaining a wide output swing for the amplifier.

Figure 12:
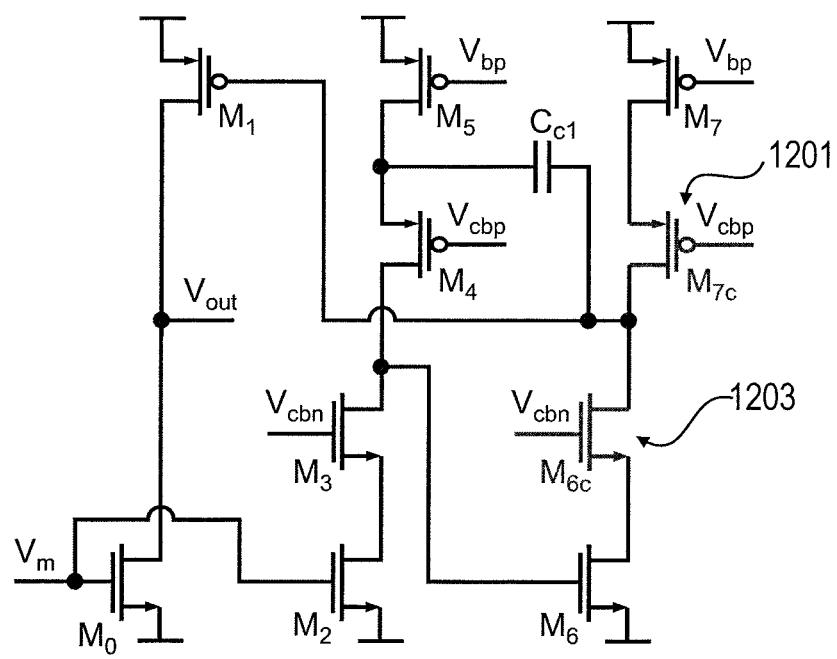
FIG. 12 illustrates an embodiment providing improved DC gain by using additional cascode devices.

As a starting point to introducing the lateral gain enhancement technique, let us first examine the issues associated with utilization of additional cascode devices to improve DC gain. As shown in FIG. 12, the amplifier structure can be augmented by including additional cascode devices 1201 and 1203 on the second stage of the sense amplifier. Unfortunately, in advanced CMOS processes that utilize low supply voltages and have transistors with low intrinsic gain ($g_m r_o$), the approach of FIG. 12 leads to degraded output signal swing for the amplifier since the stage which drives the output stage must also provide a reasonable swing due to the low gain provided by the output stage. As such, the approach of using the extra cascode devices shown in FIG. 12 might be suitable with older CMOS processes that support relatively high supply voltages and high intrinsic gain devices, but should generally be avoided in advanced CMOS processes with lower supply voltages.

Figure 13A:
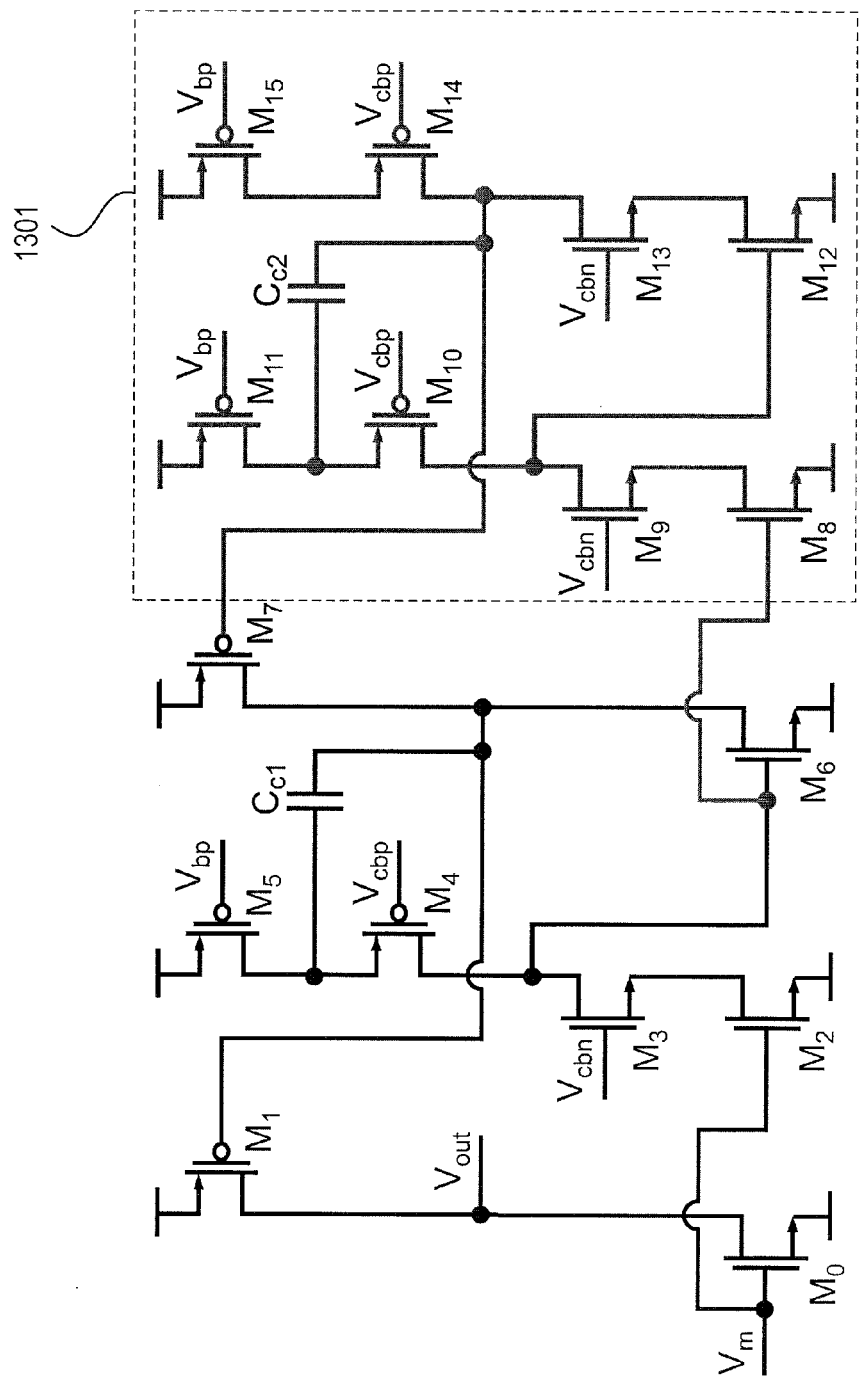
FIG. 13A illustrates an embodiment utilizing a lateral gain enhancement technique.

FIG. 13A shows an embodiment of the proposed lateral gain enhancement technique in which an additional two stage amplifier 1301 augments the 3-stage amplifier structure shown, e.g., in FIG. 5. Further examination of FIG. 13A leads to the observation that the newly included two stage amplifier 1301, which we will refer to as a lateral gain enhancement stage, acts as a two-stage sense amplifier to boost the DC gain of the common source amplifier formed by devices $M_6$ and $M_7$. Typically, as indicated in FIG. 13A, it is possible to cascode both stages of the lateral gain enhancement structure due to the reduced signal swings that they need to handle. By boosting the DC gain of the amplifier stage formed by devices $M_6$ and $M_7$, the lateral gain enhancement stages also boosts the overall DC gain of the proposed amplifier.

Figure 14:
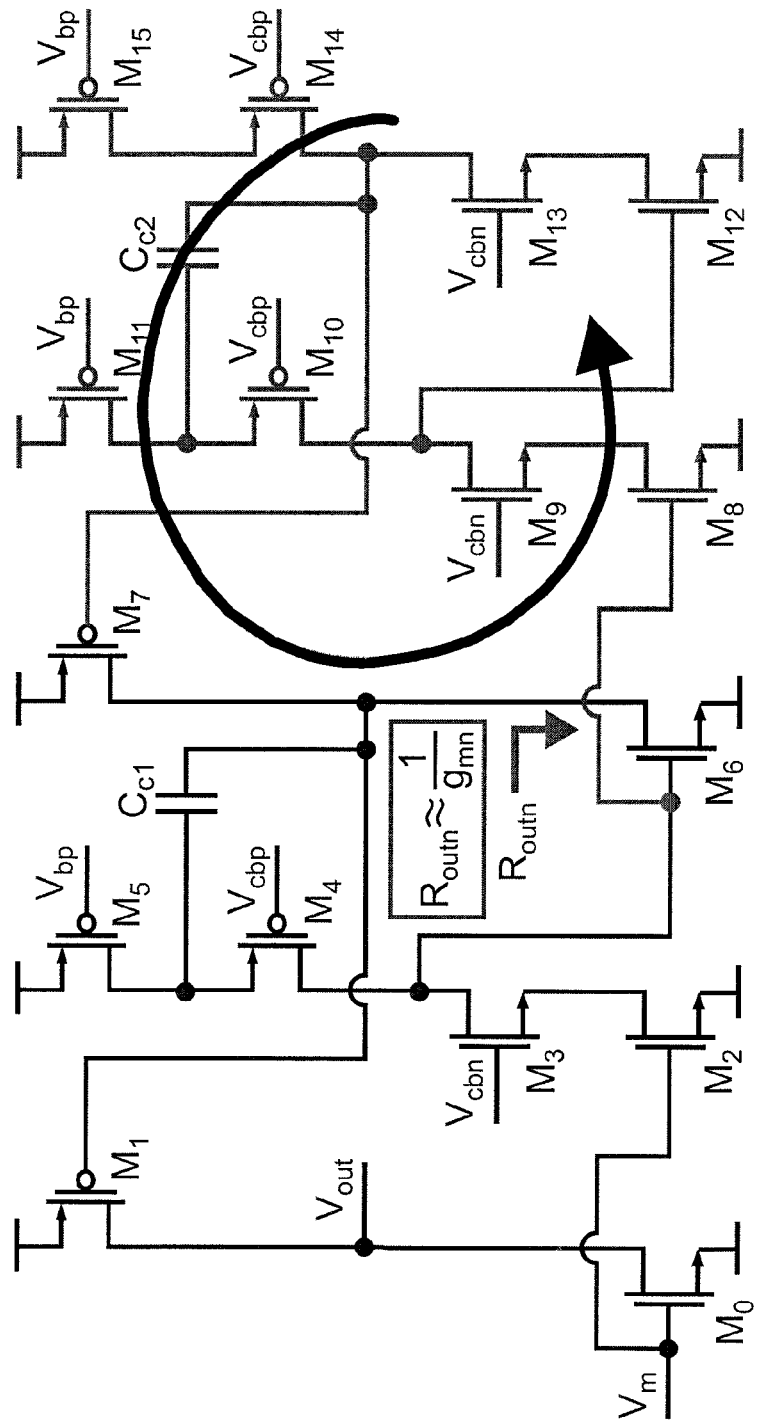
FIG. 14 illustrates an embodiment utilizing classical Miller compensation for the lateral gain enhancement stage to increase the DC gain of the amplifier.

Frequency compensation should be utilized to achieve stability of the proposed amplifier with lateral gain enhancement. As a first step in examining this issue for the lateral gain enhancement stage, FIG. 14 considers the feedback loop that it forms with devices $M_6$ and $M_7$. As discussed earlier, the use of Miller compensation capacitor $C_{c1}$ in the main, 3-stage portion of the amplifier leads to an increase in frequency of the non-dominant pole created by the $M_6$-$M_7$ stage by reducing the high frequency impedance looking into the drain of $M_6$ as indicated in FIG. 14. As such, classical 2-stage Miller compensation can be applied to the 3-stage amplifier section formed by the $M_6$-$M_7$ stage of the sense amplifier and lateral gain enhancement stage using capacitor $C_{C2}$. As indicated in FIGS. 10A, 10B and 10C, implementation of Miller compensation can take on several forms, with the preferred approach being shown in FIG. 14.

Figure 15:
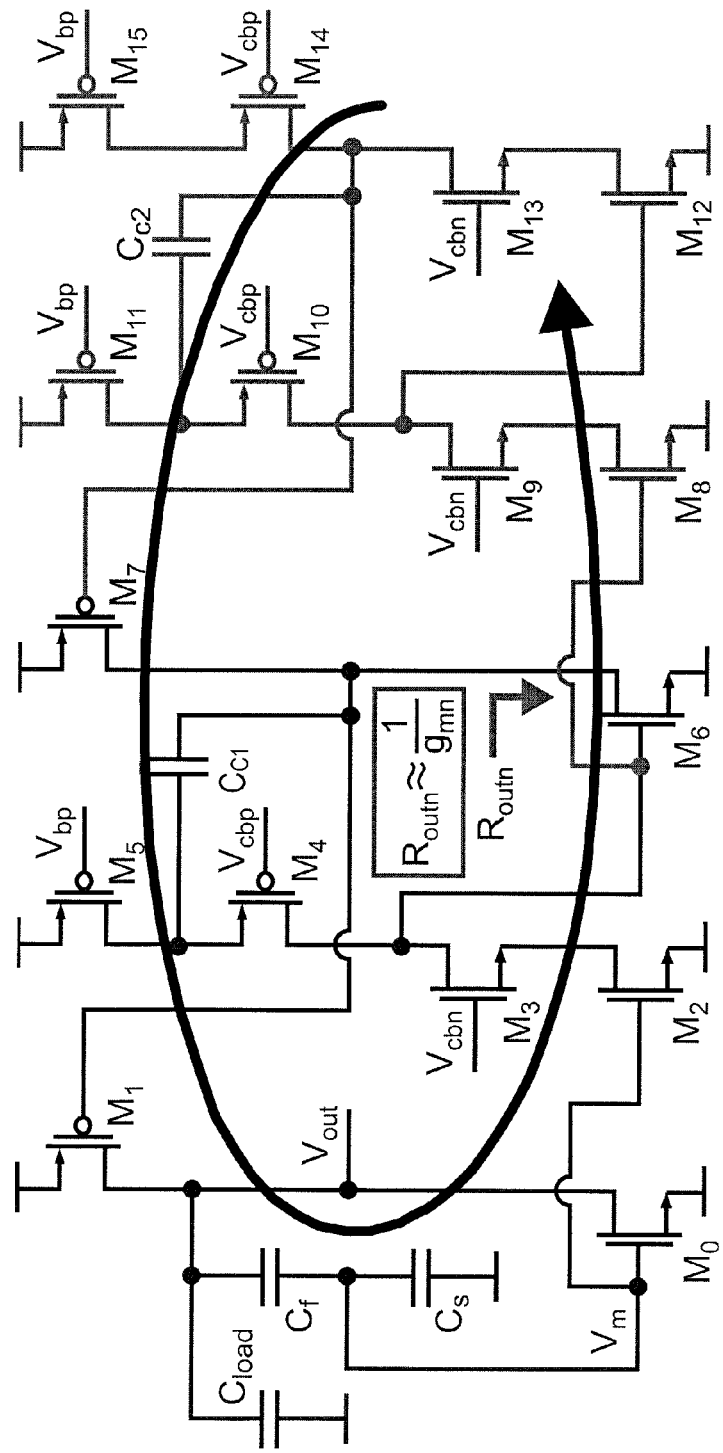
FIG. 15 illustrates consideration overall feedback dynamics when performing frequency compensation of the proposed amplifier with lateral gain enhancement.

In addition to considering the 3-stage section of the amplifier highlighted in FIG. 14, frequency compensation of the overall amplifier should also be designed to insure stability of the overall amplifier in feedback as indicated in FIG. 15. While a number of analysis and circuit techniques can be applied to achieve such stability, we consider only a simple frequency compensation technique. In this suggested approach, the value of $C_{c2}$ is first chosen such that the 3-stage subsection formed by the $M_6$-$M_7$ stage and lateral gain enhancement stage has adequate phase margin while achieving a relatively high unity gain frequency for the feedback loop indicated in FIG. 14. The second step is to then choose the value of $C_{c1}$ such that adequate phase margin is achieved for the overall feedback loop indicated in FIG. 15. In general, this leads to a much higher value for $C_{c1}$ than $C_{c2}$. Also, the amount of current running through each stage and the individual device sizing in the overall amplifier should be properly chosen based on noise and loading conditions, which will also have an impact on the proper choices of $C_{c1}$ and $C_{c2}$.

Figure 16:
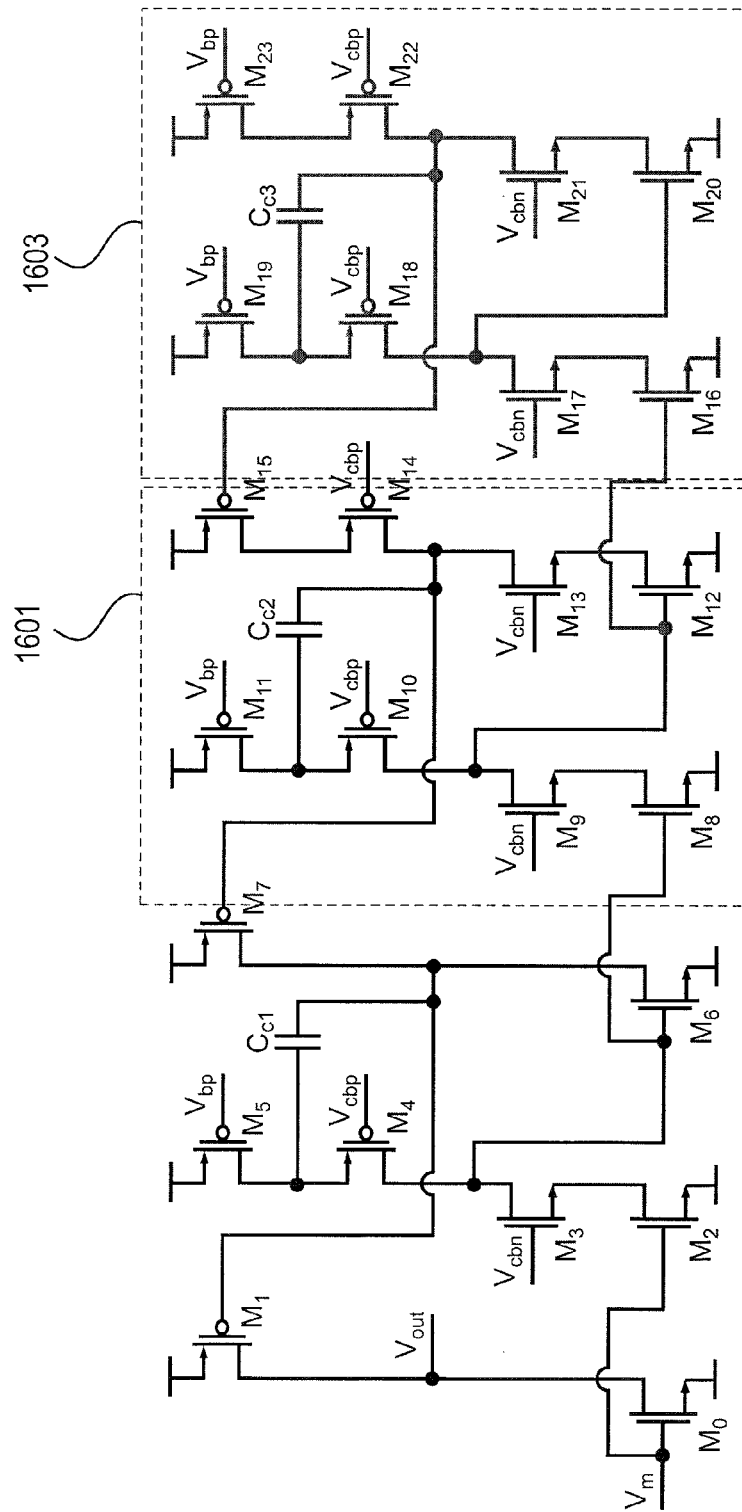
FIG. 16 illustrates an example of iterative application of lateral gain enhancement.

An interesting aspect of the proposed lateral gain enhancement technique is that it can be applied iteratively as shown in FIG. 16. In this figure, two lateral gain enhancement stages 1601 and 1603 are utilized to increase DC gain compared to the case shown in FIG. 15 in which only one lateral gain enhancement stage is utilized. In theory, an increasing number of lateral gain enhancement stages can be utilized to achieve progressively higher DC gain for the overall amplifier, and these stages can either use cascoded devices (as shown in FIG. 16), completely avoid cascoding, or choose cascoding on a selective basis where it is most beneficial. In practice, the inclusion of additional lateral gain enhancement stages brings in additional non-dominant poles that can reduce the achievable bandwidth of the amplifier assuming a given level of power consumption and desired phase margin. As such, a general design strategy is to use no more lateral gain enhancement stages than required to achieve the desired DC gain performance for the overall amplifier. Since cascode devices allow boosting of DC gain of an individual stage, it is beneficial to apply such cascoding wherever appropriate (i.e., on stages where signal swing is small enough to allow such cascoding).

Figure 13B:
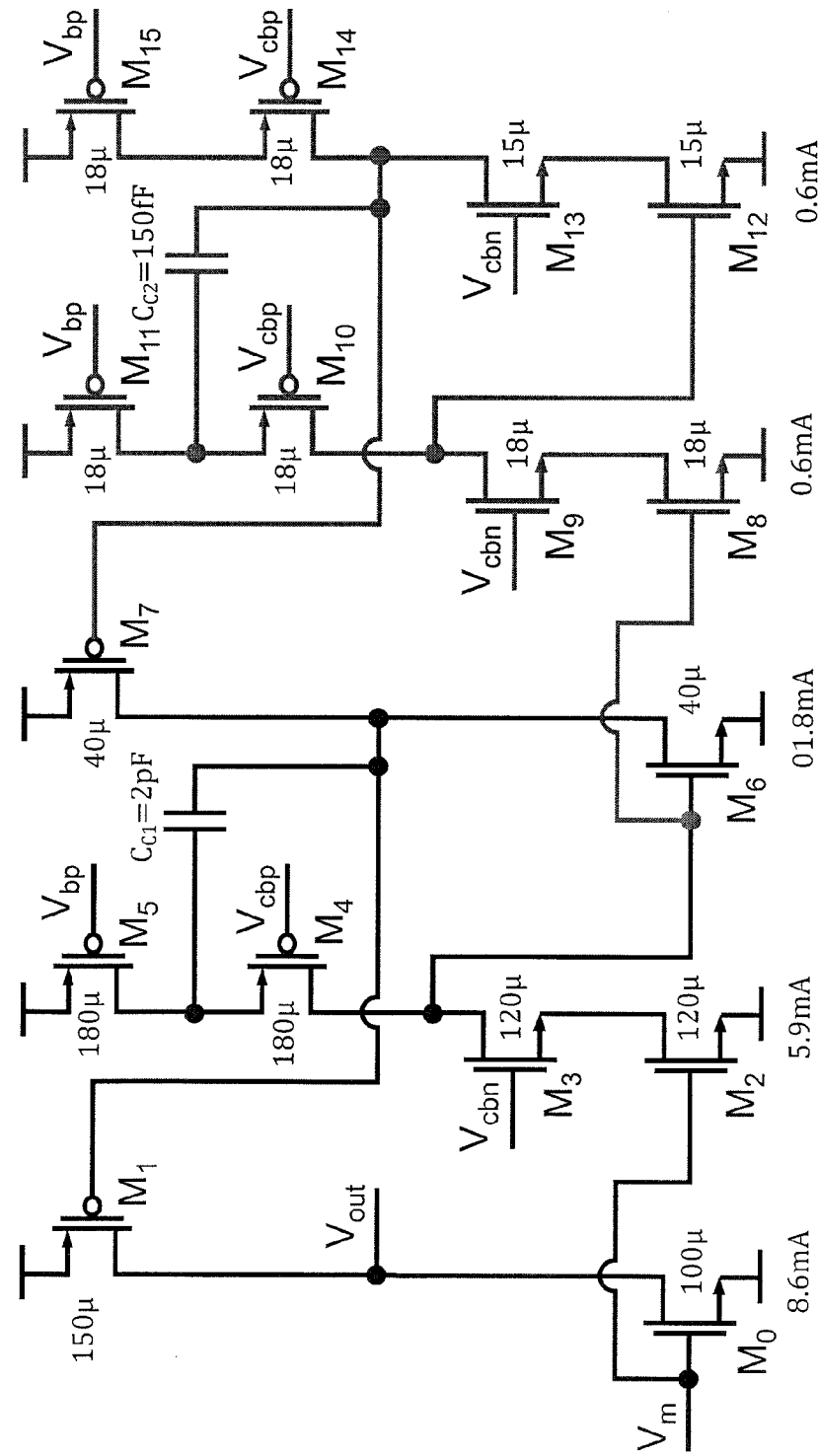
FIG. 13B illustrates an embodiment utilizing a lateral gain enhancement technique showing device sizes that may be used for a particular embodiment.
Figure 17:
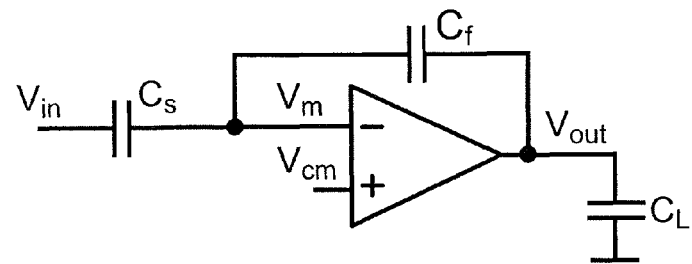
FIG. 17 illustrates a high level diagram of a test circuit used for simulation.

SPICE simulation was performed for the amplifier with lateral gain enhancement shown in FIG. 13B using the test circuit shown in FIG. 17. Simulations were performed for the amplifier for a 55 nm CMOS process. The simulations utilized the following parameter values: Cs=2 pF, Cf=0.5 pF, CL=1 pF, and supply voltage=1V for the test circuit of FIG. 17. Current was allocated to the various stages of the simulated amplifier as shown in FIG. 13B. The output stage ($M_0$-$M_1$) current of 8.6 mA was chosen to place its resulting pole frequency higher than the unity gain frequency of the overall amplifier under the assumed output capacitive load conditions. The first stage of the sensor amp ($M_2$-$M_5$) current of 5.9 mA was chosen to achieve adequately low input-referred noise for the overall amplifier. The second stage of the sensor amp ($M_6$-$M_7$) current of 1.8 mA was chosen to achieve an adequately high non-dominant pole frequency for this stage. The two stages of the gain enhancement structure ($M_8$-$M_{15}$) have relatively low currents of 0.6 mA due to the fact that noise is not of significant concern and there is relatively low loading on these stages. Given the chosen currents for each stage, the device sizes should be chosen to insure that all devices operate in saturation while achieving the desired output signal swing. In addition, relatively larger device sizes are chosen for the first stage of the sense amp ($M_2$-$M_5$) in order to achieve low thermal and 1/f noise. For the simulation, the compensation capacitor $C_{c1}$ was chosen to be 2 pF and the compensation capacitor was $C_{C2}$ was chosen to be 150 fF. FIG. 13B illustrates that the relative area and current requirements of the extra stages are modest. Of course, the examples of the current, capacitor values, and device sizes used for a particular embodiment will vary according to such factors as the process technology and application environment for the amplifier.

Given the above parameters, note that the closed loop residue gain is 4 (i.e., Cs/Cf), and the resulting feedback factor is 1/5 (i.e., Cf/(Cf+Cs)) ignoring parasitic capacitance such as Cgs of M0. Note that, in practice, Cs can be reduced while still preserving the desired residue gain by including switches that allow Vin to be sampled on Cf as well as Cs.

Figure 18A:
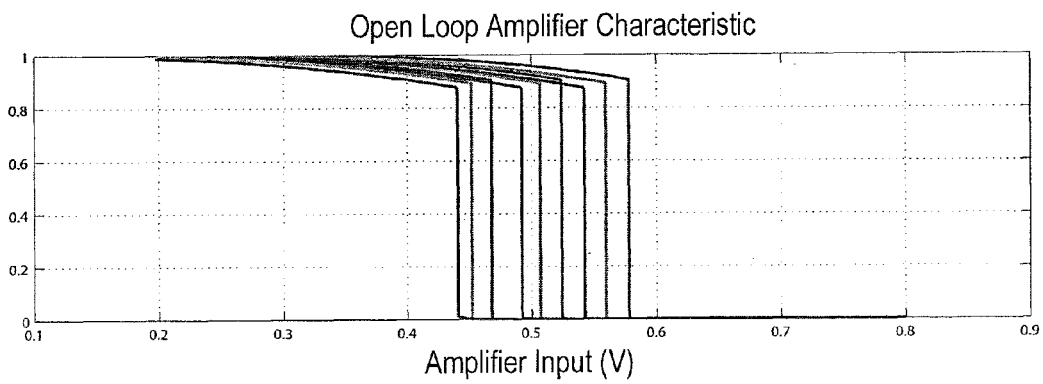
FIG. 18A shows the simulated open loop DC characteristics of the amplifier of FIG. 13.
Figure 18B:
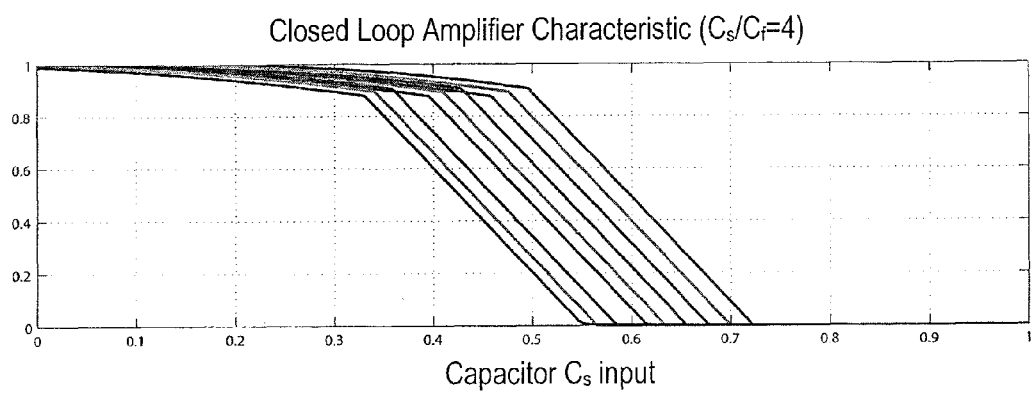
FIG. 18B shows the simulated closed loop DC characteristics of the amplifier of FIG. 13.

FIGS. 18A and 18B show the simulated open and closed loop DC characteristics of the amplifier shown in FIG. 13B across slow, typical, and fast process corners and −40, 27, and 125 degree C. temperatures. The open loop characteristic in FIG. 18A shows the very high DC gain that is achieved by the amplifier, as evidenced by its rapid transition from the 1V supply voltage to ground as the amplifier input voltage (node $V_m$ in FIG. 17) is increased. The high open loop DC gain allows very linear closed loop amplification across much of the output range as seen in FIG. 18B, which corresponds to the case where the capacitive feedback of $C_s$ and $C_f$ shown in FIG. 17 sets a closed loop residue gain of 4.

Figure 19A:
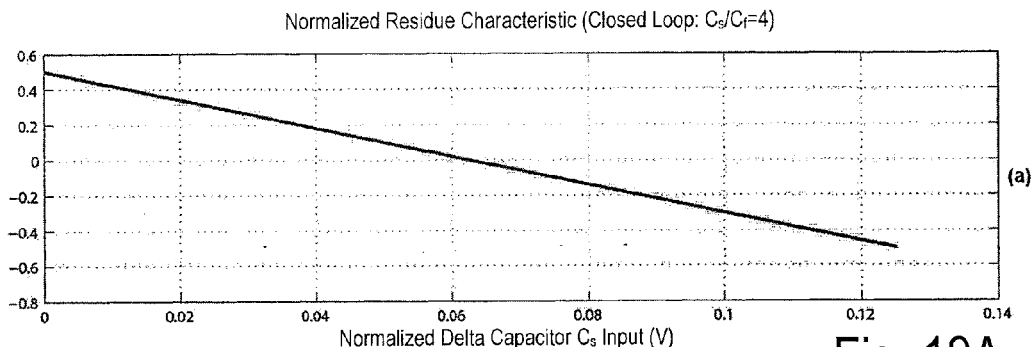
FIG. 19A displays the normalized closed loop output characteristic assuming an output voltage range of 0.2 to 0.7V (single-ended).
Figure 19B:
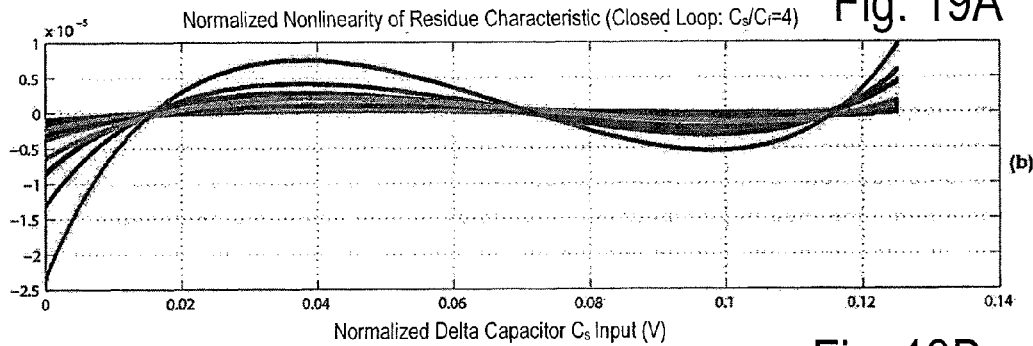
FIG. 19B displays the error from the ideal linear characteristic across output voltage range of 0.2 to 0.7V.

To better examine the issue of linearity in the closed loop DC characteristic shown in FIG. 18B, FIG. 19A displays the normalized closed loop output characteristic, assuming an output voltage range of 0.2 to 0.7V (single-ended), which translates to a 1 $V_{pp}$ differential swing assuming a pseudo-differential implementation such as shown in FIG. 8. FIG. 19B also displays the error from the ideal linear characteristic across this output range, which indicates that better than 14-bit linearity (i.e., ±0.5/$2^{14}$=±3e-5) is achieved across the slow, typical, and fast process corners and −40, 27, and 125 degree C. temperatures.

Figure 20A:
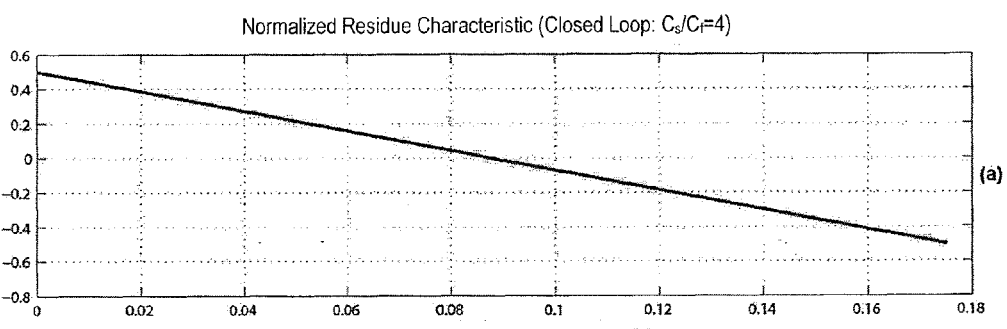
FIG. 20A displays the normalized closed loop output characteristic assuming an output voltage range of 0.1 to 0.8V (single-ended).
Figure 20B:
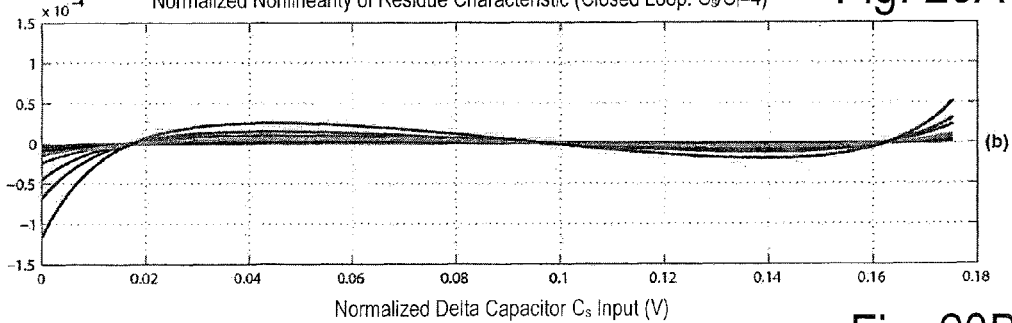
FIG. 20B displays the error from the ideal linear characteristic across the output voltage range of 0.1 to 0.8V.

FIG. 20A displays the normalized closed loop output characteristic assuming an output voltage range of 0.1 to 0.8V (single-ended), which translates to a 1.4$V_{pp}$ differential swing assuming a pseudo-differential implementation as shown in FIG. 8. FIG. 20B displays the error from the ideal linear characteristic across an output range of 0.1 to 0.8V (single-ended) across slow, typical, and fast process corners and −40, 27, and 125 degree C. temperatures, which indicates that better than 12-bit linearity (i.e., ±0.5/$2^{12}$=±1.2e-4) is achieved across the given process and temperature corners.

Figure 21:
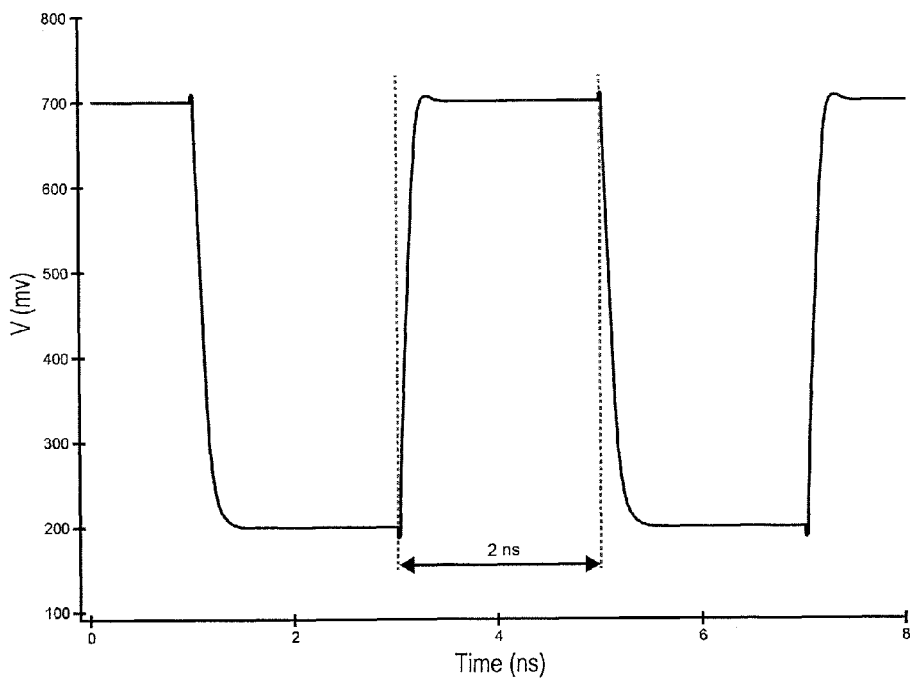
FIG. 21 shows the simulated transient performance of the amplifier when performing residue amplification with a gain of 4.

FIG. 21 shows the simulated transient performance of the amplifier when performing residue amplification with a gain of 4 (i.e., $C_s/C_f$=4) across an output voltage range of 0.2 to 0.7V. These transient results demonstrate stable and high speed performance for the amplifier.

Figure 22A:
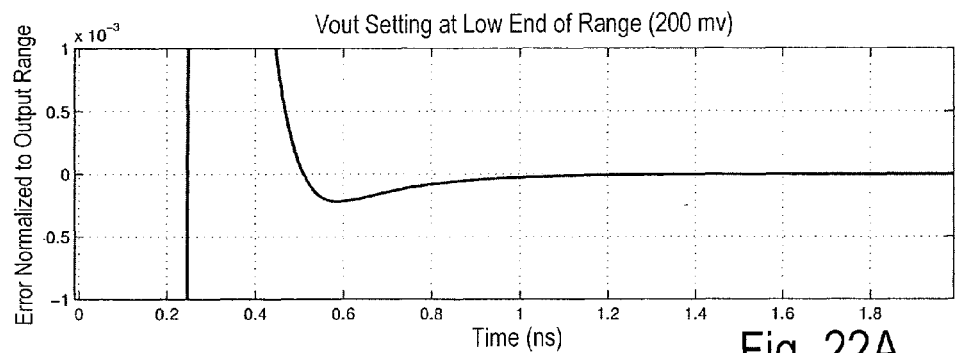
FIGS. 22A and 22B show a zoomed-in view of the transient response shown in FIG. 21.
Figure 22B:
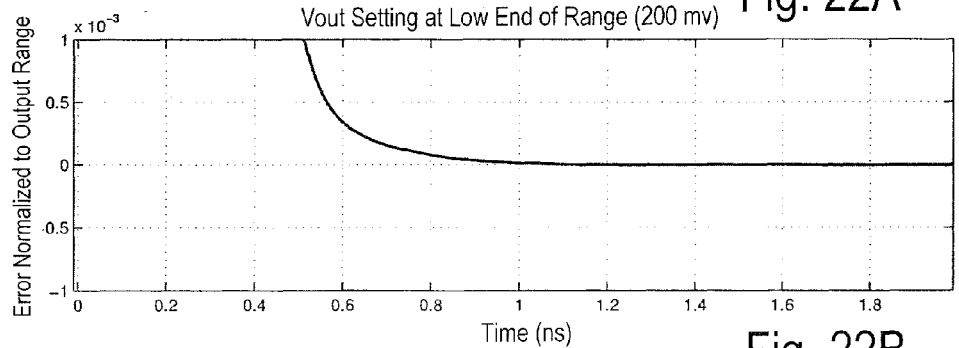

FIGS. 22A and 22B show a zoomed-in view of the transient response shown in FIG. 21 with the vertical axis scaled such that the output swing is normalized to 1 $V_{pp}$ (single-ended). This figure reveals that better than 12-bit settling (i.e., 1/$2^{12}$=2e-4) is achieved in 0.8 ns under slow process and high temperature conditions.

Overall, the simulated results demonstrate that high closed-loop linearity can be achieved across a relatively wide output signal range (i.e., 0.5$V_{pp}$ (single-ended) with a 1V supply) with the proposed amplifier structure. Since fast settling behavior is also achieved, the amplifier structure can provide a key enablement technology for achieving high speed, high performance pipeline ADCs in advanced CMOS processes.

Thus, various aspects have been described relating to an amplifier topology providing high DC gain and wide output voltage range. While the description has focused on switched capacitor networks, the techniques described herein may be used in applications beyond switched capacitor networks. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An apparatus comprising:
   an amplifier including,
      an amplifier output stage including a first and a second transistor, the output stage supplying an amplifier output signal at an amplifier output node;
      a sense amplifier having an input coupled to a gate of the first transistor and having an output coupled to a gate of the second transistor to thereby control current from the second transistor; and
   an impedance coupled between the amplifier output node and the gate of the first transistor.

2. The apparatus as recited in claim 1 wherein the impedance is capacitive.

3. The apparatus as recited in claim 1 wherein the apparatus forms a stage of a pipelined analog-to-digital converter.

4. The apparatus as recited in claim 1 wherein the sense amplifier comprises a first stage and a second stage.

5. The apparatus as recited in claim 4 wherein the first stage includes cascode devices and a current source device and the second stage includes a second current source device and the second stage has an output node coupled to the gate of the second transistor to thereby control the current from the second transistor.

6. The apparatus as recited in claim 5 further comprising a bias network to supply bias voltages to the current source device and cascode devices.

7. The apparatus as recited in claim 4 wherein the current from the second transistor is controlled in order to achieve reduced voltage variation at the gate of the first transistor as a function of voltage of the amplifier output signal.

8. The apparatus as recited in claim 4 further comprising a lateral gain enhancement stage augmenting the first, second, and output stage of the amplifier to boost overall DC gain of the amplifier.

9. The apparatus as recited in claim 8 wherein the lateral gain enhancement stage includes a first lateral gain stage and a second lateral gain stage.

10. The apparatus as recited in claim 9 wherein the first lateral gain stage and the second lateral gain stage each include cascode devices.

11. The apparatus as recited in claim 1 wherein the apparatus comprises:
  a psuedo differential amplifier structure including two single-ended amplifiers,
  wherein a first of the two single-ended amplifiers includes the amplifier output stage including the first and the second transistor and the sense amplifier, wherein the amplifier output signal supplied by the amplifier output stage is a first output of the pseudo differential amplifier structure, and
  wherein a second of the two single-ended amplifiers includes a second amplifier output stage including a third and a fourth transistor and a second sense amplifier, wherein a second output signal supplied by the second amplifier output stage is a second output of the pseudo differential amplifier structure.

12. The apparatus as recited in claim 11 wherein the psuedo-differential structure includes a common bias circuit.

13. The apparatus as recited in claim 11 wherein the psuedo-differential structure comprises a stage of a pipelined analog-to-digital converter and the apparatus further includes a switch between inputs of the first and second single ended amplifiers that is closed during a sampling phase of the analog-to-digital converter.

14. A method comprising:
  receiving an input signal at an amplifier input node;
  amplifying the input signal using an amplifier and supplying an amplifier output signal;
  sensing input voltage at the amplifier input node using a sense amplifier; and
  adjusting current in an output stage of the amplifier based on an output of the sense amplifier; and
  feeding back the output signal through an impedance to the amplifier input node.

15. The method as recited in claim 14 further comprising achieving reduced voltage variation at the amplifier input node as a function of voltage of the amplifier output signal by the adjusting of the current in the output stage of the amplifier based on the output of the sense amplifier, the reduced voltage variation being in comparison to a basic common source amplifier.

16. The method as recited in claim 14 further comprising using a bias network to supply bias voltages to a current source and cascode devices in the sense amplifier.

17. The method as recited in claim 14 further comprising boosting DC gain of the amplifier by using a lateral gain enhancement stage augmenting the output stage, and first and second stages of the sense amplifier.

18. A switched capacitor analog-to-digital converter comprising:
  a plurality of stages, at least one of the stages including,
    a switched capacitor network including at least a first capacitor and a second capacitor;
    an amplifier coupled to the first and second capacitors, the amplifier including,
      an amplifier output stage supplying an amplifier output signal at an amplifier output node;
      a sense amplifier coupled to sense voltage at an input node of the amplifier and achieve reduced voltage variation at the input node as a function of voltage of the amplifier output signal by controlling current through the amplifier output stage based on the sensed voltage;
    wherein the first capacitor is coupled between the amplifier output node and the input node of the amplifier.

19. The switched capacitor ADC as recited in claim 18 wherein the amplifier output stage further comprises:
  a first transistor coupled respectively between a first power supply node and the amplifier output node at first and second current carrying terminals and having a gate node coupled to receive the amplifier input signal;
  a second transistor coupled respectively between a second power supply node and the amplifier output node at first and second current carrying terminals and having a gate node coupled to an output of the sense amplifier.

20. The switched capacitor ADC as recited in claim 18 further comprising a lateral gain enhancement stage augmenting the output stage and stages of the sense amplifier.

* * * * *